(12) United States Patent
Turner

(10) Patent No.: US 11,381,908 B2
(45) Date of Patent: Jul. 5, 2022

(54) CONTROLLER FOR AN ELECTROMECHANICAL TRANSDUCER

(71) Applicant: Michael James Turner, Whixley North Yorksh (GB)

(72) Inventor: Michael James Turner, Whixley North Yorksh (GB)

( * ) Notice: Subject to any disclaimer, the term of this patent is extended or adjusted under 35 U.S.C. 154(b) by 0 days.

(21) Appl. No.: 16/635,997

(22) PCT Filed: Jul. 19, 2018

(86) PCT No.: PCT/GB2018/052044
§ 371 (c)(1),
(2) Date: Jan. 31, 2020

(87) PCT Pub. No.: WO2019/025757
PCT Pub. Date: Feb. 7, 2019

(65) Prior Publication Data
US 2020/0177990 A1    Jun. 4, 2020

(30) Foreign Application Priority Data

Aug. 1, 2017   (GB) ..................................... 1712391

(51) Int. Cl.
*H04R 3/00*      (2006.01)
*H02P 7/025*    (2016.01)
(Continued)

(52) U.S. Cl.
CPC ............. *H04R 3/002* (2013.01); *H02P 7/025* (2016.02); *H03F 1/3264* (2013.01); *H03F 3/181* (2013.01);
(Continued)

(58) Field of Classification Search
CPC ............................... H04R 29/00; H04R 3/007
(Continued)

(56) References Cited

U.S. PATENT DOCUMENTS

| | | | |
|---|---|---|---|
| 1,534,842 | A | 4/1925 | Evers |
| 1,535,538 | A | 4/1925 | Maxfield et al. |

(Continued)

FOREIGN PATENT DOCUMENTS

| | | | |
|---|---|---|---|
| CA | 2408045 | A1 | 4/2003 |
| CA | 2408340 | A1 | 4/2003 |

(Continued)

OTHER PUBLICATIONS

PCT Search Report for corresponding PCT Application No. PCT/GB2018/052044 dated Oct. 10, 2018, 11 pages.

(Continued)

*Primary Examiner* — Alexander Krzystan
(74) *Attorney, Agent, or Firm* — Lee & Hayes, P.C.

(57) ABSTRACT

A controller for an electromechanical transducer is provided. The controller comprises driving means operable to actuate a mechanical output of the transducer; impedance cancelling means operable to at least partially cancel an electrical impedance of the transducer; and linearising means between an input of the controller and the driving means. The linearising means are operable to generate an output signal by modifying an input signal of the linearising means to compensate for nonlinear behaviour of the transducer. The linearising means are operable to receive one or more state signals indicative of one or more state variables of the transducer, the one or more state signals comprising a velocity signal indicative of a velocity of the mechanical output of the transducer.

19 Claims, 13 Drawing Sheets

(51) Int. Cl.
| | |
|---|---|
| H03F 1/32 | (2006.01) |
| H03F 3/181 | (2006.01) |
| H04R 3/04 | (2006.01) |
| H04R 9/06 | (2006.01) |
| H04R 29/00 | (2006.01) |

(52) U.S. Cl.
  CPC ............... *H04R 3/04* (2013.01); *H04R 9/06* (2013.01); *H04R 29/003* (2013.01); *H03F 2200/03* (2013.01); *H03F 2200/129* (2013.01); *H03F 2201/3221* (2013.01)

(58) Field of Classification Search
  USPC .................................................... 381/55, 56
  See application file for complete search history.

(56) References Cited

U.S. PATENT DOCUMENTS

| | | |
|---|---|---|
| 1,822,758 A | 9/1931 | Toulon |
| 2,194,175 A | 3/1940 | Wilhelm |
| 2,887,532 A | 5/1959 | Werner |
| 2,897,291 A | 7/1959 | Burker |
| 2,948,778 A | 8/1960 | Clements |
| 3,009,991 A | 11/1961 | Bekey |
| 3,014,096 A | 12/1961 | Clements |
| 3,057,961 A | 10/1962 | Turner |
| 3,073,899 A | 1/1963 | Farnsworth, III |
| 3,530,244 A | 9/1970 | Reiffin |
| 3,647,969 A | 3/1972 | Korn |
| 3,798,374 A | 3/1974 | Meyers |
| 3,821,473 A | 6/1974 | Mullins |
| 3,889,060 A | 6/1975 | Goto et al. |
| 3,937,887 A | 2/1976 | Miller |
| 4,118,600 A | 10/1978 | Stahl |
| 4,180,706 A | 12/1979 | Bakgaard |
| 4,220,040 A | 9/1980 | Noguchi et al. |
| 4,243,839 A | 1/1981 | Takahashi et al. |
| 4,256,923 A | 3/1981 | Meyers |
| 4,335,274 A | 6/1982 | Ayers |
| 4,387,270 A | 6/1983 | Sakano et al. |
| 4,395,588 A | 7/1983 | Franssen, deceased, et al. |
| 4,488,012 A | 12/1984 | Matsuda et al. |
| 4,550,430 A | 10/1985 | Meyers |
| 4,573,189 A | 2/1986 | Hall |
| 4,727,584 A | 2/1988 | Hall |
| 4,797,933 A | 1/1989 | Hahne |
| 4,868,870 A | 9/1989 | Schrader |
| 4,908,870 A | 3/1990 | Nagi |
| 4,943,956 A | 7/1990 | Noro |
| 4,944,020 A * | 7/1990 | Noro .......................... H03F 1/30 381/96 |
| 4,969,195 A | 11/1990 | Noro |
| 4,997,057 A | 3/1991 | Furukawa |
| 5,031,221 A | 7/1991 | Yokoyama |
| 5,068,903 A | 11/1991 | Walker |
| 5,129,005 A | 7/1992 | Zwicky et al. |
| 5,226,089 A | 7/1993 | Yoon et al. |
| 5,245,296 A | 9/1993 | Miller et al. |
| 5,280,543 A | 1/1994 | Yokoyama et al. |
| 5,537,479 A | 7/1996 | Kreisel et al. |
| 5,542,001 A | 7/1996 | Reiffin |
| 5,588,065 A | 12/1996 | Tanaka et al. |
| 5,764,781 A | 6/1998 | Ding |
| 5,771,300 A | 6/1998 | Daniels |
| 5,815,585 A | 9/1998 | Klippel |
| 6,104,817 A | 8/2000 | Ding |
| 6,353,670 B1 | 3/2002 | Gasner |
| 6,584,204 B1 | 6/2003 | Al-Ali et al. |
| 6,975,734 B1 | 12/2005 | Suzuki |
| 7,053,705 B2 | 5/2006 | Hench et al. |
| 8,073,149 B2 | 12/2011 | Kuze |
| 8,401,207 B2 | 3/2013 | Stanley |
| 8,538,040 B2 | 9/2013 | Kim |
| 2002/0159606 A1 | 10/2002 | Hobelsberger |
| 2005/0077862 A1* | 4/2005 | Jordison ............. H02P 25/0925 318/701 |
| 2006/0164075 A1* | 7/2006 | Niwa .................... G01D 3/0365 324/207.16 |
| 2008/0272721 A1* | 11/2008 | Mayes ...................... H02P 6/15 318/701 |
| 2011/0228945 A1* | 9/2011 | Mihelich ................ H04R 3/002 381/59 |
| 2012/0281844 A1* | 11/2012 | Luo ......................... H03F 3/181 381/55 |
| 2015/0086027 A1 | 3/2015 | Moser et al. |
| 2015/0249888 A1 | 9/2015 | Bogdanov |
| 2015/0249889 A1 | 9/2015 | Iyer et al. |
| 2015/0303884 A1 | 10/2015 | Morishima |
| 2015/0304772 A1* | 10/2015 | Risberg .................. H04R 3/002 381/55 |
| 2016/0079937 A1 | 3/2016 | Fay |
| 2016/0157014 A1* | 6/2016 | Van Schyndel ........ H04R 3/007 381/55 |
| 2020/0200937 A1* | 6/2020 | Widmer ................ B60L 53/122 |

FOREIGN PATENT DOCUMENTS

| | | |
|---|---|---|
| CN | 2394380 Y | 8/2000 |
| CN | 2501155 Y | 7/2002 |
| CN | 2554871 Y | 6/2003 |
| CN | 2624570 Y | 7/2004 |
| CN | 105916079 | 8/2016 |
| CN | 20180064126 | 5/2020 |
| CN | 201880064126 | 5/2020 |
| DE | 2507436 A1 | 8/1976 |
| DE | WO9921395 A1 | 4/1999 |
| DE | 1020004021546 A1 | 12/2005 |
| EP | 0048116 A1 | 3/1982 |
| EP | 0838973 | 4/1998 |
| EP | 3662680 | 6/2020 |
| FR | 2884077 A1 | 10/2006 |
| FR | WO2006106231 A2 | 10/2006 |
| GB | 231972 | 4/1925 |
| GB | 1534842 | 12/1978 |
| GB | 2187607 A | 9/1987 |
| GB | 2261784 A | 5/1993 |
| GB | 2413233 A | 10/2005 |
| GB | 2542210 | 3/2017 |
| JP | S5829295 A | 2/1983 |
| JP | H0213003 A | 1/1990 |
| JP | H0632531 B2 | 4/1994 |
| JP | H1070788 A | 3/1998 |
| JP | 3286191 B2 | 5/2002 |
| JP | 2004254128 A | 9/2004 |
| JP | 2008061212 A | 3/2008 |
| NL | WO2006043219 A1 | 4/2006 |
| RU | 2008146355 A | 5/2010 |
| WO | WO9921395 | 4/1999 |
| WO | WO2016082046 | 6/2016 |

OTHER PUBLICATIONS

Turner, Michael J. et al.: "The Use of Negative Source Impedance with Moving Coil Loudspeaker Drive Units: A Review and Analysis", AES Convention 122; May 2007, AES, 60 East 42nd Street, Room 2520, New York 10165-2520, USA; May 1, 2007, CP040508144.

Colloms, M.; "High Performance Loud Speakers", 6th Edition, John Wiley, Chinchester, 2005, pp. 177-179.

ATL—Advanced Transmission Line, PMC, retrieved from website: https://pmc-speakers.com/technology/atl; 2 pages.

Audio Pro AB, "Ace-Bass 2 Subwoofer", commercial product catalogue/trade literature, Audio Pro AB, Sweden, 2004.

Augspurger, "Loudspeakers on Damped Pipes", Journal of the Audio Engineering Society, vol. 48 No. 5, pp. 424-436, May 2000.

Beranek, "Acoustics", 1993 edition, Acoustical Society of America, pp. 184-207, New York, 1996.

Bolaños, "Frequency Domain Experiences in Loudspeaker Suspensions", 116th Convention of the Audio Engineering Society, Berlin, Germany, May 2004, 19 pages.

(56) References Cited

OTHER PUBLICATIONS

Catrysse, "On the Design of Some Feedback Circuits for Loudspeakers", Journal of the Audio Engineering Society, vol. 33, issue 6, Jun. 1985, pp. 430-435.
De Boer, "Theory of Motional Feedback", Institution of Radio Engineers (IRE) Transactions on Audio, vol. 9, issue 1, part 1, Jan. 1961, pp. 15-21.
Eargle, "Loudspeaker Handbook", second edition, Kluwer Academic Publishers, pp. 1-19, Boston, 2003.
Gao, et al., "Adaptive linearization of a loudspeaker", Proceedings of the IEEE International Conference on Acoustics, Speech, and Signal Processing, vol. 5, pp. 3589-3592, Toronto, Apr. 1991.
GB Search Report for corresponding GB Patent Application No. GB 1712391.0 dated Jan. 15, 2018, 1 page.
Greiner, et. al., "Loudspeaker Distortion Reduction", Journal of the Audio Engineering Society, vol. 32 No. 12, pp. 956-963, Dec. 1984.
Hanson, "A Motional Feedback Loudspeaker System", 46th Convention of the Audio Engineering Society, New York, Sep. 1973, 18 pages.
Harwood, "Loudspeaker Distortion with Low Frequency Signals", Journal of the Audio Engineering Society, vol. 20 No. 9, pp. 718-728, Nov. 1972.
Holdaway, "Controlling the Upper-Frequency Characteristics of Velocity Feedback Loudspeaker Systems", IEEE Transactions on Audio, Sep.-Oct. 1963, pp. 174-182.
Holdaway, "Design of Velocity Feedback Transducer Systems for Stable Low Frequency Behavior", IEEE Transactions on Audio, Sep.-Oct. 1963, pp. 155-173.
Hutt, "Ambient Temperature Influences on OEM Automotive Loudspeakers", 112th Convention of the Audio Engineering Society, Paper 5507, Munich, May 2002, 10 pages.
Kaiser, "Modelling of the Nonlinear Response of an Electrodynamic Loudspeaker by a Volterra Series Expansion", Journal of the Audio Engineering Society, vol. 35 No. 6, pp. 421-433, Jun. 1987.
Klippel, "Active Compensation of Transducer Nonlinearities", 23rd Audio Engineering Society International Conference on Signal Processing in Audio Recording and Reproduction, Copenhagen, May 2003, 17 pages.
Klippel, "Adaptive Nonlinear Control of Loudspeaker Systems", Journal of the Audio Engineering Society, vol. 46, Issue 11, pp. 939-954, Nov. 1998.
Klippel, "Direct Feedback Linearization of Nonlinear Loudspeaker Systems", Journal of the Audio Engineering Society, vol. 46 Issue 6, pp. 499-507, Jun. 1998.
Klippel, "Loudspeaker Nonlinearities—Causes, Parameters, Symptoms", 119th Convention of the Audio Engineering Society, New York, Oct. 2005.
Klippel, "The Mirror Filter—A New Basis for Reducing Nonlinear Distortion and Equalizing Response in Woofer Systems", Journal of the Audio Engineering Society, vol. 40 Issue 9, pp. 675-691, Sep. 1992.
Knudsen, et al., "Low-Frequency Loudspeaker Models That Include Suspension Creep", Journal of the Audio Engineering Society, vol. 41 No. 1/2, pp. 3-18, Jan./Feb. 1993.
Lane, et. al., "Improving Loudspeaker Performance for Active Noise Control Applications", Journal of the Audio Engineering Society, vol. 46, issue 6, Jun. 1998, pp. 508-519.
Leach, "Active Equalization of Closed-Box Loudspeaker Systems", Journal of the Audio Engineering Society, vol. 29 No. 6, pp. 405-406, Jun. 1981.
Lipshitz, "The Loudspeaker in the Digital Age", keynote address, 32nd International Conference of the Audio Engineering Society: DSP For Loudspeakers, Hillerød, Denmark, Sep. 2007, 28 pages.
Mills, et. al., "Distortion Reduction in Moving Coil Loudspeaker Systems Using Current Drive Technology", Journal of the Audio Engineering Society, vol. 37, Issue 3, Mar. 1989, pp. 129-148.
Normandin, "Extended Low frequency Performance of Existing Loudspeaker Systems", Journal of the Audio Engineering Society, vol. 32, issue 1/2, Jan./Feb. 1984, pp. 18-22.
Recklinghausen, "Dynamic Equalization for Loudspeakers", Journal of the Audio Engineering Society, vol. 28, Issue 11, Nov. 1980, pp. 770-775.
Rousseau et al., "Visco-elastic Aspects of Loudspeaker Drivers", 118th Convention of the Audio Engineering Society, Barcelona, Spain, Paper 6524, May 2005, 8 pages.
Small, "Direct Radiator Loudspeaker System Analysis", Journal of the Audio Engineering Society, vol. 20 No. 5, pp. 383-395, Jun. 1972.
Small, "Passive-Radiator Loudspeaker Systems: Parts I: Analysis", Journal of the Audio Engineering Society, vol. 22 No. 8, pp. 592-601, Oct. 1974.
Small, "Passive-Radiator Loudspeaker Systems Parts II: Synthesis", Journal of the Audio Engineering Society, vol. 22 No. 9, pp. 683-689, Nov. 1974.
Staggs, "Transient Response Equalization of Sealed-Box Loudspeakers", Journal of the Audio Engineering Society, vol. 30 No. 12, pp. 906-911, Dec. 1982.
Stuart, "Active Loudspeakers", 21st U.K. Conference of the Audio Engineering Society: Audio At Home, Cambridge, Apr. 2006, 15 pages.
Thiele, "Loudspeakers in Vented Boxes: Part 1", Journal of the Audio Engineering Society, vol. 19 No. 5 pp. 382-392, May 1971.
Thiele, "Loudspeakers in Vented Boxes: Part 2", Journal of the Audio Engineering Society, vol. 19 No. 6, pp. 471-483, Jun. 1971.
Turner, et al., "The Use of Negative Source Impedance with Moving Coil Loudspeaker Drive Units: An Analysis and Review", 122nd Convention of the Audio Engineering Society, Vienna, 2007, 31 pages.
Werner, "Loudspeakers and negative impedances", IRE Transactions on Audio, vol. 6, No. 4, part 1, pp. 83-89, Jul.-Aug. 1958.
EPO Examination Report dated May 27, 2021 From EP18749074A (Published as EP3662680A1) (5 pages).
Office Action dated Mar. 9, 2021 From China Patent Application No. 21880064126, "Controller for an Electromechanical Transducer", by Michael James Turner.
Notice of Grant dated Oct. 22, 2021 From China Patent Application No. 21880064126, "Controller for an Electromechanical Transducer", by Michael James Turner.
Office Action dated Mar. 9, 2021 From China Patent Application No. 201880064126, "Controller for an Electromechanical Transducer", by Michael James Turner.
Notice of Grant dated Oct. 22, 2021 From China Patent Application No. 201880064126, "Controller for an Electromechanical Transducer", by Michael James Turner.

* cited by examiner $$EQ(s) = \frac{T(s)}{D(s)}$$

where $T(s)$ is the target or desired frequency response

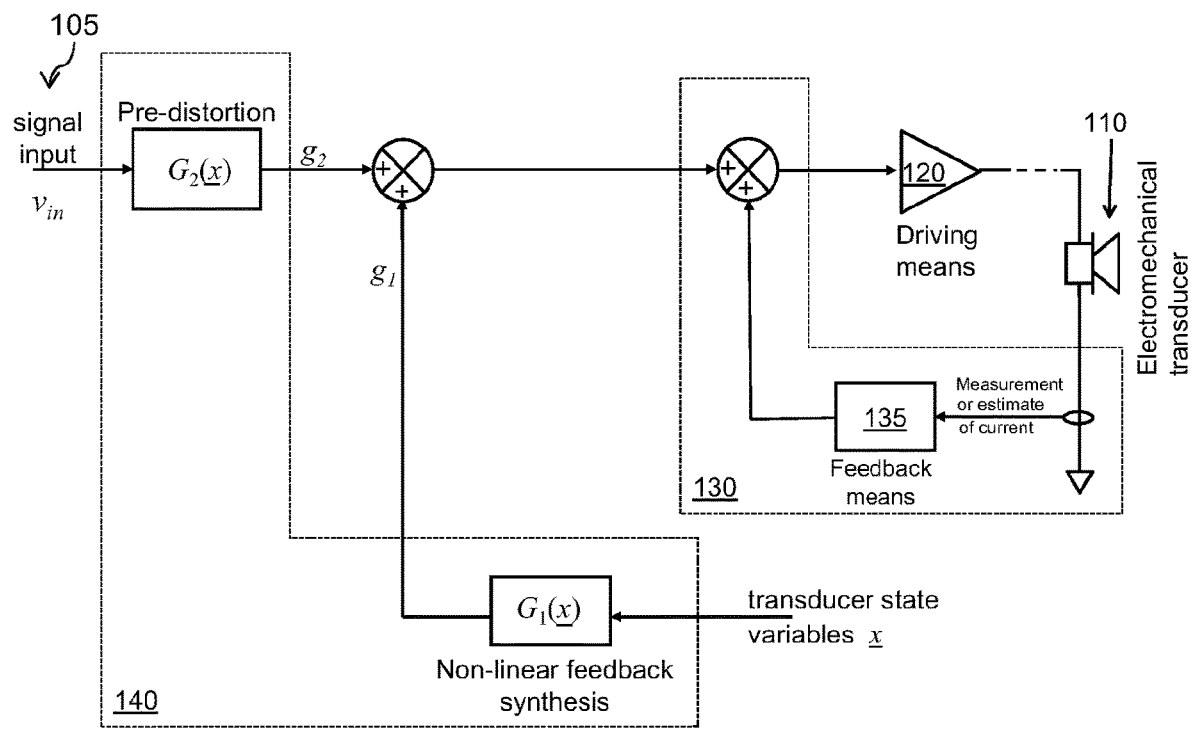
Fig. 21 where vector $\underline{x}$ includes one or more of the displacement signal, the velocity signal, or the current signal

CONTROLLER FOR AN ELECTROMECHANICAL TRANSDUCER

RELATED APPLICATIONS

This application is a national stage application under 35 U.S.C. 371 of PCT International Application No. PCT/GB2018/052044, filed Jul. 19, 2018, which claims priority to Great Britain Patent Application GB 1712391.0, filed on Aug. 1, 2017, entitled "CONTROLLER FOR AN ELECTROMECHANICAL TRANSDUCER," which applications are hereby incorporated by reference in their entirety.

FIELD

The present disclosure relates generally to a controller for an electromechanical transducer.

BACKGROUND

The electrodynamic (e.g. moving coil) loudspeaker is an example of an electromechanical transducer in which the movement of the actuated coil is transferred to a diaphragm that creates the sound. Moving coil loudspeakers are ubiquitous, accounting for the vast majority of loudspeakers ever produced. The technology underlying the moving coil loudspeaker has not changed significantly for many years and will be well known to the skilled person. Conventionally, a loudspeaker motor is operated passively and in an "open-loop" fashion. That is to say, it is driven by an electrically separate power amplifier which takes no account of the loudspeaker's actual dynamic behaviour or acoustical output. In practice, however, the vibrations of the diaphragm of the loudspeaker, and hence resulting sound pressure, do not necessarily faithfully follow the amplifier's output voltage. Clearly, it is advantageous to improve the accuracy of the loudspeaker output to be as faithful to the input as possible.

A review of techniques for operating loudspeakers from negative source impedances is provided in "*The use of negative source impedance with moving coil loudspeaker drive units: an analysis and review*" by Michael J. Turner and David A. Wilson (Audio Engineering Society Convention 122, 2007).

SUMMARY

Aspects of the present disclosure are defined in the accompanying independent claims.

BRIEF DESCRIPTION OF THE DRAWINGS

Examples of the present disclosure will now be explained with reference to the accompanying drawings in which:

FIG. 21 shows a diagram of another control arrangement as described herein.

Throughout the description and the drawings, like reference numerals refer to like parts.

DETAILED DESCRIPTION

Overview

Figure 1:
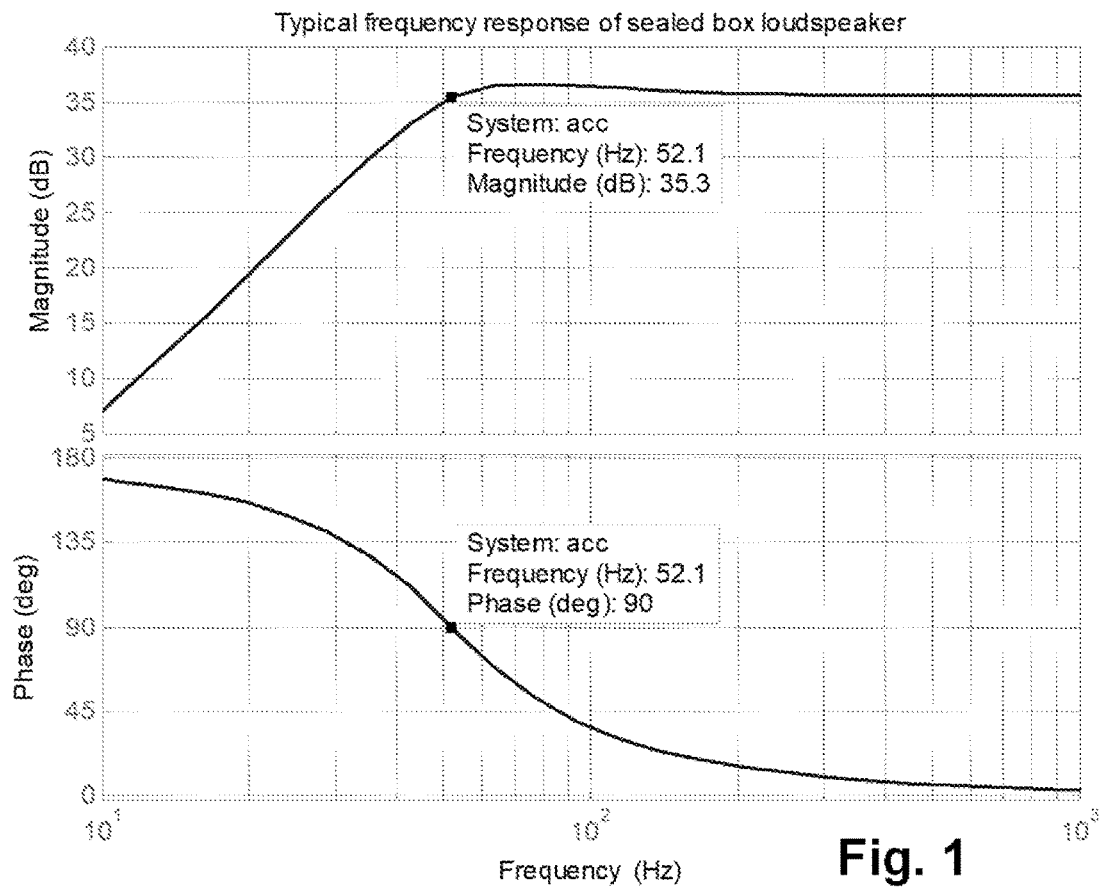
FIG. 1 shows a typical low frequency response of a sealed-box loudspeaker system.

In overview, the present disclosure relates to a controller for an electromechanical transducer. The controller comprises driving means that are operable to actuate a mechanical output of the transducer. The controller further comprises impedance cancelling means that are operable to at least partially cancel an electrical impedance of the transducer. The controller further comprises linearising means between an input of the controller and the driving means. The linearising means are operable to generate an output signal by modifying an input signal of the linearising means to compensate for nonlinear behaviour of the transducer. The linearising means are operable to receive one or more state signals indicative of one or more respective state variables of the transducer. The one or more state signals comprise a velocity signal indicative of a velocity of the mechanical output of the transducer, but may additionally or alternatively comprise other state signals.

Context

The present disclosure is principally concerned with improvements to the operation and control of electrodynamic (i.e. moving coil or moving magnet) loudspeakers. However, as will be appreciated by those skilled in the art, the present disclosure and disclosed examples are also applicable to other types of electrodynamic load such as voice coil motors, actuators and shakers. From herein onwards, the present disclosure will use the terms "drive unit" (meaning a voice coil motor as actuator and diaphragm as output, assembled around a chassis of some kind), and "moving coil loudspeaker" or simply "loudspeaker" to represent the load, with the understanding that the ideas described here may be readily applied or adapted to other types of electrodynamic load, and that the use of these terms is not intended to limit the scope or applicability of the present disclosure. Similarly, although the moving part of most electrodynamic loads, such as loudspeakers, is the so-called "voice coil", a moving magnet type of motor may be employed (the load coil then being mechanically fixed) without altering the basic operation of the present disclosure and disclosed examples.

The present disclosure is particularly (though not exclusively) concerned with ameliorating the limitations of electrodynamic loudspeakers when operating at low frequencies. Specifically, it addresses the following issues:

a) The need in a conventional loudspeaker system for a large enclosure, if reproduction is to extend to the lowest audio frequencies without recourse to electronic equalisation.

b) Conversely, the need for accurately-matched frequency response compensation, or "equalisation", if—in a loudspeaker system with a relatively small enclosure— an extended low frequency response is sought by increased amplification of low frequency signals.

c) Non-uniformity of amplitude and phase response within the intended frequency range of operation, particularly where caused by variations in mechanical and acoustical loading of the loudspeaker motor.

d) The poor transient response associated with conventional sealed-box and, especially, ventilated (ported or transmission-line) enclosures.

e) The significant variations in loudspeaker performance that can occur with temperature, signal history, age and between production samples—particularly where caused by inconsistency of the drive unit's mechanical parameters (i.e. stiffness and mechanical losses, which are notably difficult to accurately and consistently model for control purposes). This has a direct bearing on point (b), above.

f) The high levels of nonlinear distortion associated with the large diaphragm excursions that are necessary to reproduce even moderately high sound pressure levels at low frequencies, especially in physically small loudspeaker systems.

The present disclosure may in different forms improve some or all aspects (a) to (f) above and with potentially low additional manufacturing or component cost.

FIG. 1 shows the frequency response of a typical moving coil drive unit mounted in a sealed enclosure. A salient feature of this frequency response is that for frequencies significantly below that of the mechanical resonance (here approximately 52 Hz), the acoustic output falls at a rate of 12 dB/octave due to the second-order nature of the system's dynamic response. The spring-mass resonant frequency fsm, and hence the lower cut-off frequency of the loudspeaker, is determined by $$f_{sm} = \frac{1}{2\pi}\sqrt{\frac{K_S}{M}} \text{ (Hz)} \quad (1)$$

where $K_S$ is the total spring stiffness of the diaphragm with its surround and suspension, together with that of the air inside the enclosure, and M is the effective moving mass (including air loading of the diaphragm).

One way to achieve subjectively good bass reproduction is to extend the low frequency response to as low a value as is reasonably possible. It will be apparent from the above equation (1) that this may be achieved with a high value of mass M, or a low value of stiffness $K_S$, or both. Increasing M will reduce the mid-band sensitivity of the loudspeaker— which is proportional to the reciprocal of M. It may therefore instead be appropriate to make the stiffness $K_S$ as low as possible, commensurate with sufficient mechanical consistency and robustness. Because the total mechanical stiffness includes that due to air inside the enclosure, relatively large enclosures are needed if deep bass is to be reproduced. The pneumatic stiffness of the air within a small enclosure will otherwise dominate, making the resonant frequency undesirably high—even if the inherent mechanical stiffness of the drive unit alone is relatively low.

However, large enclosures may not appeal to customers having a limited amount of space in which to place their loudspeaker(s). A number of approaches for extending the low frequency response using a control arrangement coupled to the drive unit are set out below.

Control Arrangement Approaches

Figure 2:
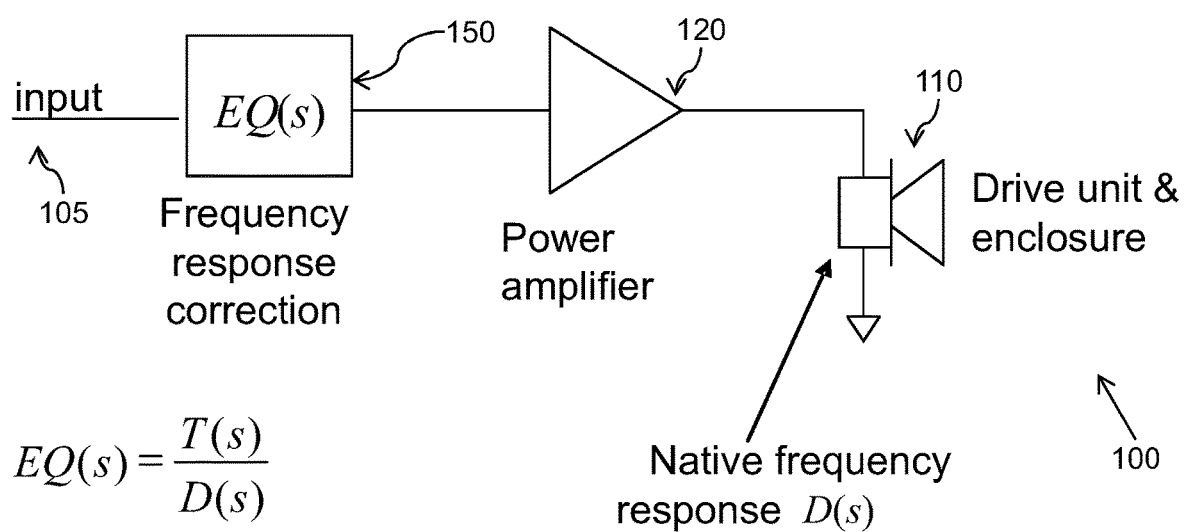
FIG. 2 illustrates the use of equalisation to correct or improve frequency response.

Active loudspeakers—using dedicated amplifier systems—have sought to compensate for the limited low frequency response inherent in passive loudspeaker systems through the use of equalising filters placed in the signal path ahead of the power amplifier used to drive the loudspeaker, as illustrated in FIG. 2. In FIG. 2, an equalising filter with frequency response $$EQ(s) = \frac{T(s)}{D(s)}$$

is used to achieve a target or desired frequency response T(s) and compensates for the drive unit's native frequency response D(s). However, this approach can be sensitive to parameter variations in the loudspeaker driver units, variations of which may cause non-uniformity of the resulting frequency response, especially the variable mechanical stiffness. Furthermore, this approach—essentially boosting the low-frequency input to the drive unit—not only fails to address the issues of non-linear distortion in general, but can make it worse—notably those distortions that arise at large motor excursions, since for a given sound pressure level the diaphragm displacement increases with the inverse-square of frequency.

Figure 3:
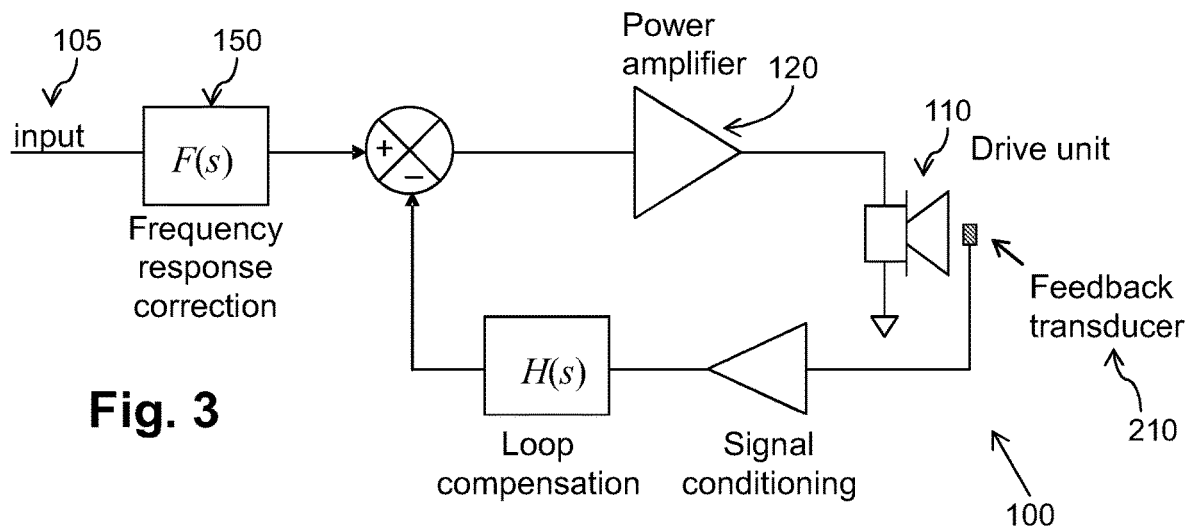
FIG. 3 illustrates a basic motional feedback scheme using microphone or sensor feedback.

Negative feedback or "servo control" may be used for improving the performance of dynamic systems, and has been proposed for loudspeakers, as illustrated in FIG. 3. A way of applying it to a conventional loudspeaker would be to measure the actual acoustical output of the diaphragm with a microphone, compare the resulting feedback signal with the desired sound pressure, and to use the resulting error signal to compensate for the loudspeaker's deficiencies. A factor limiting the use of a microphone as the feedback transducer may be cost; a high quality microphone, capable of excellent linearity at high sound pressure levels, may be needed. Sensitivity to external disturbances (i.e. to sound pressure not emanating from the diaphragm) is also a potential issue, as is the inconvenience of mounting the microphone in front of the loudspeaker.

The use of "motional feedback" could potentially address some or even all of the issues described above. In this arrangement, a mechanical parameter of voice coil motion (i.e. displacement, velocity or acceleration) is measured by a transducer of some sort, and compared with the desired signal in a negative feedback arrangement (FIG. 3 again). This may require a customised loudspeaker drive unit equipped with some kind of sensor, which may considerably increase the system cost. The additional sensor or transducer can also significantly reduce the drive unit sensitivity because it may increase the total moving mass, thereby increasing the necessary amplifier power and consequent voice coil heating, for a given sound pressure level.

Figure 4:
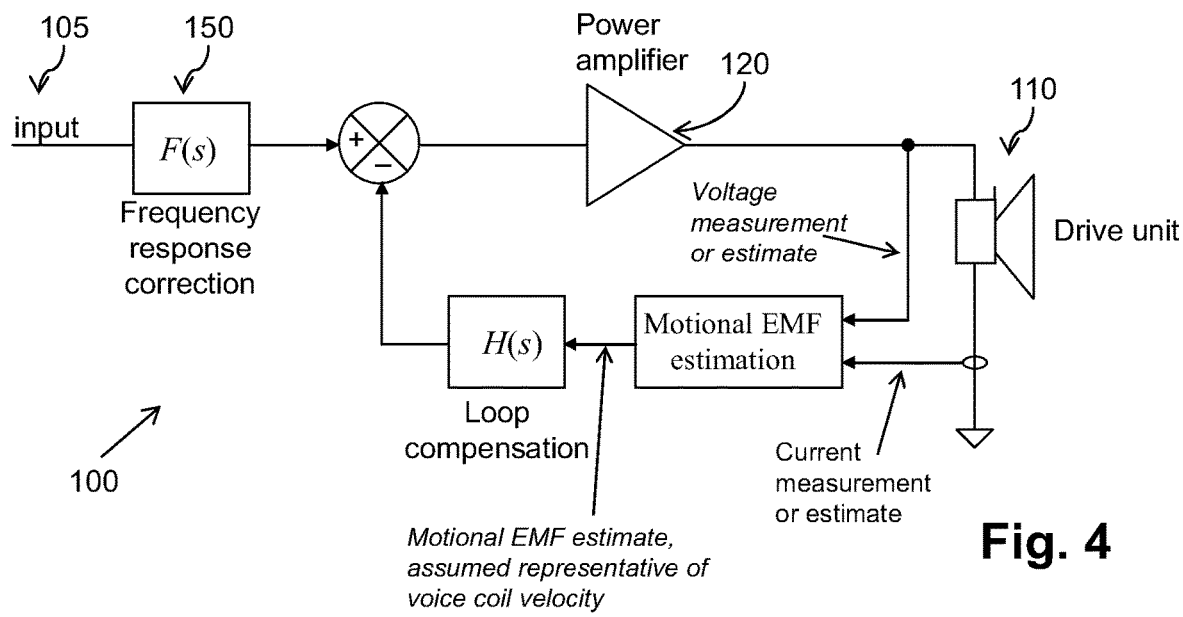
FIG. 4 illustrates a motional feedback scheme using an estimate of motional electromotive force (EMF)

Electrodynamic transducers such as loudspeakers produce force, and hence motion in the actuated body, through the interaction of an electric current with a magnetic field. This transduction mechanism is reciprocal in the sense that relative movement between the electrical conductors (e.g. of the voice coil) and the magnetic field induces in the conductors a voltage or "motional EMF" that is proportional to the velocity of that movement. It has been found that, if arrangements are made to sense or estimate the motional electromotive force (EMF), as illustrated in FIG. 4, the motional EMF itself can be used as a velocity feedback signal. Eliminating the need for a separate transducer in this way allows motional feedback to be applied to an existing moving coil drive unit without modification, and may be beneficial in terms of cost and complexity.

A difficulty with using the motional EMF as a velocity feedback signal is that its linearity is dependent on the motor force factor (commonly referred to in the art as "Bl") being constant, whereas in practice this parameter may be significantly dependent on voice coil displacement and/or current. If the resulting nonlinear velocity estimate is used as the feedback signal in a closed loop control system, then the actual voice coil velocity may be modulated as a function of displacement and/or current. The acoustical output over much of the working frequency range of a typical loudspeaker is proportional to the differential of velocity, and as a result serious acoustical distortion may result at large displacements (where the linearising effects of well-conceived motional feedback are most needed). A further difficulty arises in that the estimate of motional EMF will usually be derived by subtracting from the applied voice coil voltage the voltage dropped across the voice coil's electrical impedance (which generally comprises both electrical resistance and inductance). For the method to work well, accurate knowledge of this impedance is therefore required, and this is made difficult not only by the temperature dependence of the DC resistance, but also because the inductance may have significant dependence on displacement and/or current, and furthermore may have significant and displacement-dependent eddy current losses, so that accurate modelling of the electrical impedance for control purposes is difficult.

Figure 9:
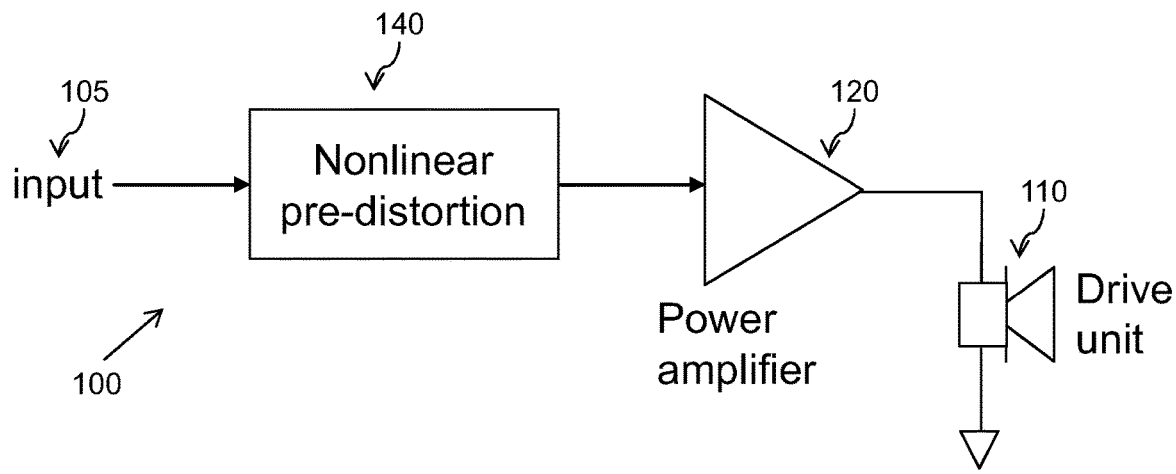
FIG. 9 illustrates the use of nonlinear pre-distortion attempting to cancel drive unit nonlinearities.

Another approach to reducing loudspeaker distortion is to apply nonlinear processing to the amplifier input signal such that the "pre-distortion" cancels out the nonlinearities inherent in the drive unit, as illustrated in FIG. 9. It has been found that the loudspeaker nonlinearities are, however, functions of the dynamic system's state variables (i.e. voice coil velocity, displacement and current) and therefore this "feed-forward" nonlinear pre-processing cannot be a simple time-invariant function such as a fixed polynomial.

Feed-forward pre-distortion may be applied that only seeks to address nonlinearity associated with the motor force factor. If a more comprehensive feed-forward linearisation is to be attempted, a more complex dynamic nonlinear model may be needed in order to synthesise the requisite nonlinear pre-distortion. A difficulty, however, is that existing practicable models of the drive unit cannot sufficiently account for the real-world signal and environmental dependence of the mechanical nonlinearities—in particular the suspension stiffness. Achieving a sufficiently accurate pre-distortion is therefore difficult, and in practice the method may well worsen rather than improve the overall distortion result.

Velocity Follower

Figure 5:
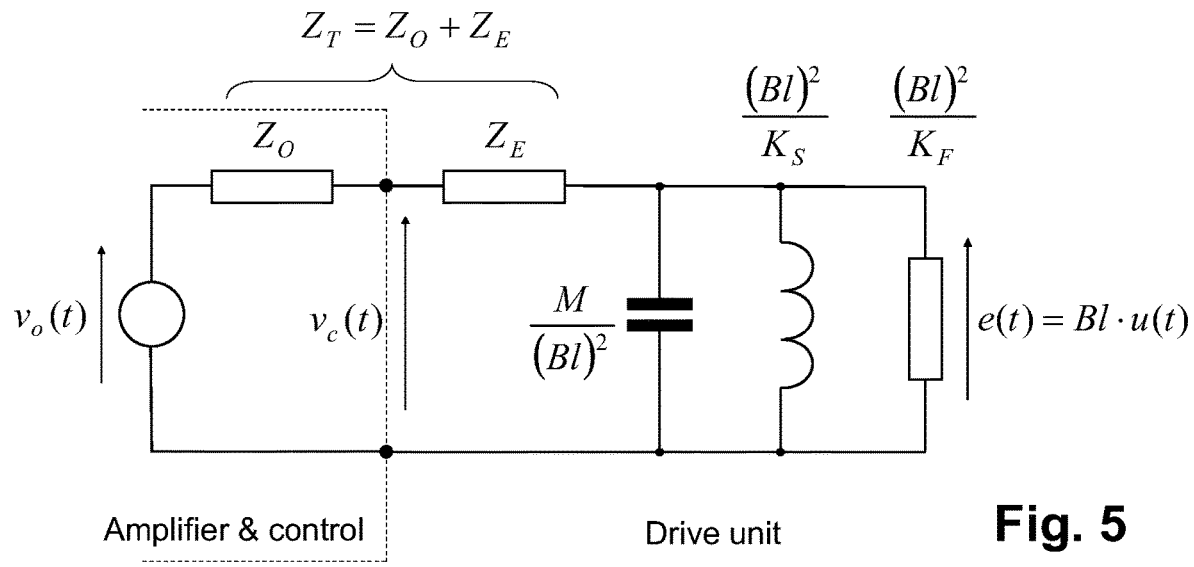
FIG. 5 shows a simplified electrical equivalent circuit of an amplifier and a drive unit.

The voice coil's blocked electrical impedance may be cancelled as a means of achieving velocity control over a limited, but useful, bandwidth. The technique which will be described here utilises band-limited velocity control of the loudspeaker drive unit through at least partial cancellation of the voice coil's electrical impedance. The loudspeaker drive unit can be modelled as a generator having open-circuit voltage e (by definition, the "motional EMF") which is proportional to velocity, and having "blocked" (i.e. stationary) electrical impedance $Z_E$. The loudspeaker is driven by an amplifier having output impedance $Z_O$, as illustrated in FIG. 5, which also shows the drive unit's principal mechanical parameters (mass M, frictional losses $K_F$ and stiffness $K_S$) modelled through the conventional electrical "mobility" equivalent circuit.

Figure 6:
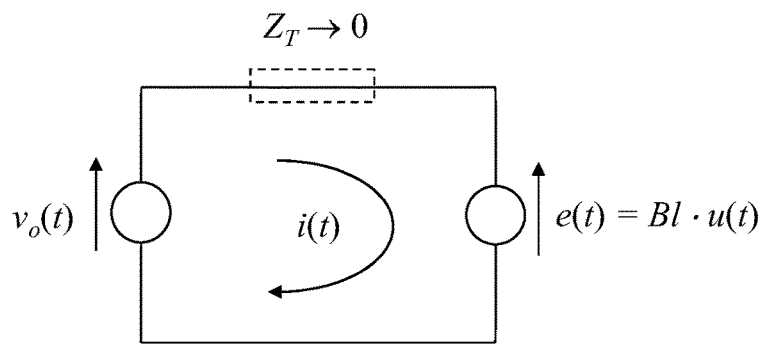
FIG. 6 illustrates the "velocity follower" principle.

If $Z_O$ could be made to equal $-Z_E(s)$ then, as shown in FIG. 6, there would effectively be zero impedance between the internal Thévenin source of the amplifier and the voice coil "generator". This would then force the motional EMF e to be equal to $V_O$. If in practice the impedance cancellation is significant but less than less than complete, then over a limited bandwidth the velocity of the voice coil u(f) follows the desired signal $v_o(t)$ in a simple algebraic relationship which, if the loudspeaker motor behaves in a substantially linear manner, involves only the motor constant Bl:

$$u(t) \approx \frac{v_o(t)}{Bl} \qquad (2)$$

As equation (2) shows, the response within the velocity control bandwidth is desirably independent of the mechanical parameters. For this reason, the technique of impedance cancellation may be effective in greatly extending the low frequency response without the need for low stiffness or high mass in the drive unit. For the same reason, the technique may also be effective in reducing suspension-related distortions, especially those due to nonlinear behaviour of the suspension stiffness. The term "velocity follower" may be used to describe this motional feedback scheme, in which velocity control is achieved by substantial cancellation of the voice coil's electrical impedance.

Complete cancellation of the voice coil's blocked impedance may not be practicable, but is in any case not necessary for the method to be useful. A practical limitation may be imposed by the voice coil inductance, which may limit the highest frequency for which substantial cancellation can practicably be achieved. Whilst it is possible to synthesise a complex negative output impedance, and thereby cancel the majority of the voice coil's inductance as well as its resistance, this may be difficult in practice due to nonlinear displacement dependence of the inductance and its eddy current losses.

Figure 7A:
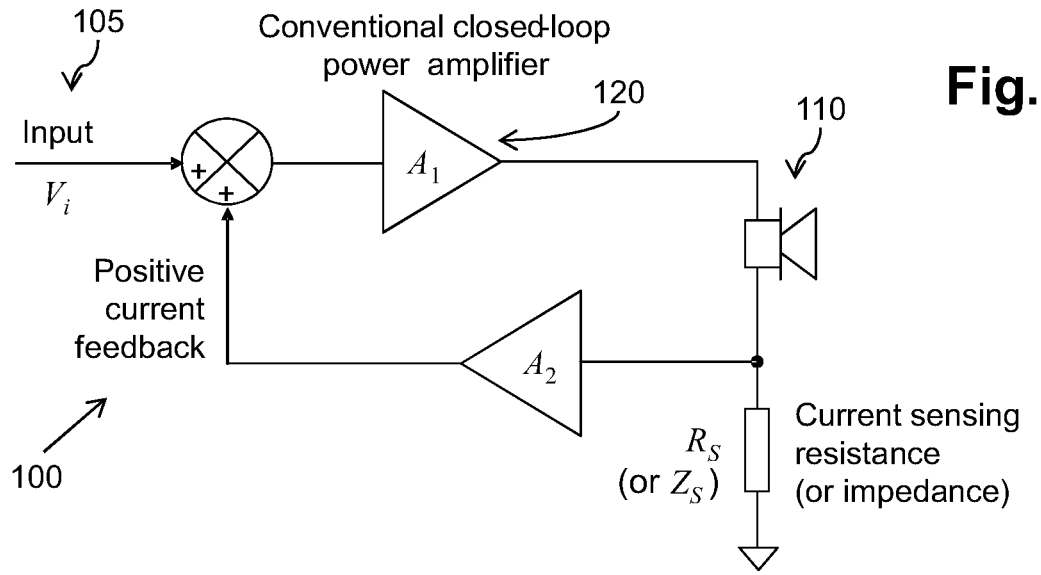
FIGS. 7a and 7b illustrate the use of positive current feedback to cancel the electrical impedance of a drive unit or load.
Figure 7B:
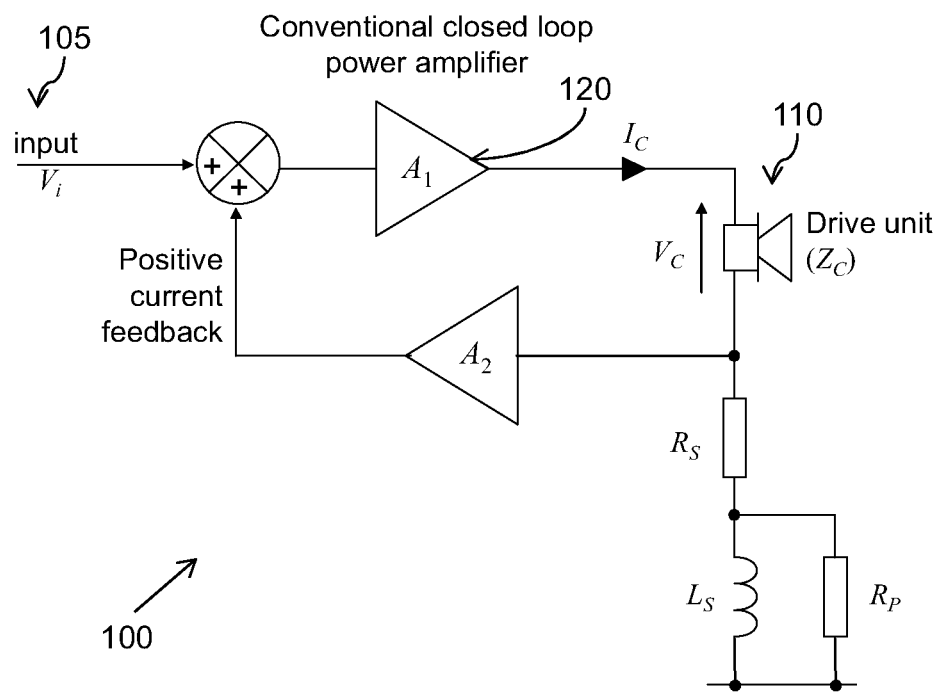

An arrangement for providing a negative amplifier output impedance is shown in FIG. 7a. The output impedance of the amplifier will be a negative resistance if the current sensing impedance $Z_S$ is purely resistive, but $Z_S$ may, if desired, be made complex, comprising multiple resistive and reactive elements so as to synthesise any desired negative output impedance. By way of example, FIG. 7b shows the current sensing impedance $Z_S$ comprising both resistive and inductive components, in order to at least partially cancel the voice coil inductance as well as its DC resistance. In this case, resistor RP is intended to make some allowance for eddy current losses in the voice coil inductance. As will be appreciated by one skilled in the art, a more complex network may be used in position $Z_S$ so as to more accurately match the electrical parameters of any given drive unit.

A further alternative (and essentially equivalent) arrangement for providing a complex (as opposed to purely resistive) negative source impedance is to make the feedback loop gain a function of frequency. This leads to the more generic arrangement shown in FIG. 8, in which the current feedback is applied via transfer function H(s). If desired, a combination of complex sensing impedance Z(s) and frequency-dependent feedback H(s) could be employed.

Figure 8:
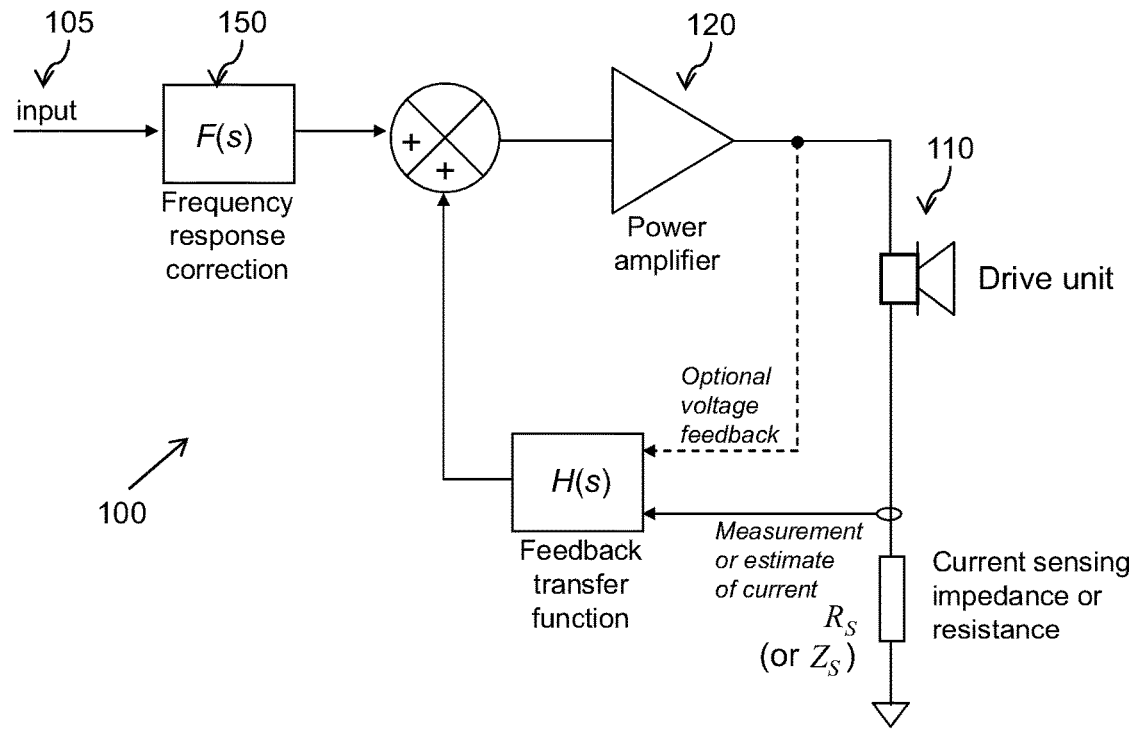
FIG. 8 illustrates a generic motional feedback loudspeaker system using positive current feedback for voice coil impedance cancellation.

In a loudspeaker, the acoustical output is of course what ultimately matters, and at low and medium frequencies (relative to the drive unit's intended range) this is determined by voice coil acceleration. Since, in the present disclosure, velocity is being controlled, the input signal to the system as a whole may therefore be integrated (at least down to some minimum desired frequency) in order to produce a "velocity reference" signal. This frequency response correction is not shown in FIGS. 7a and 7b, but may be included in any of the examples described herein, and could in particular be incorporated in the overall frequency response correction F(s) as shown in FIG. 8.

Figure 10:
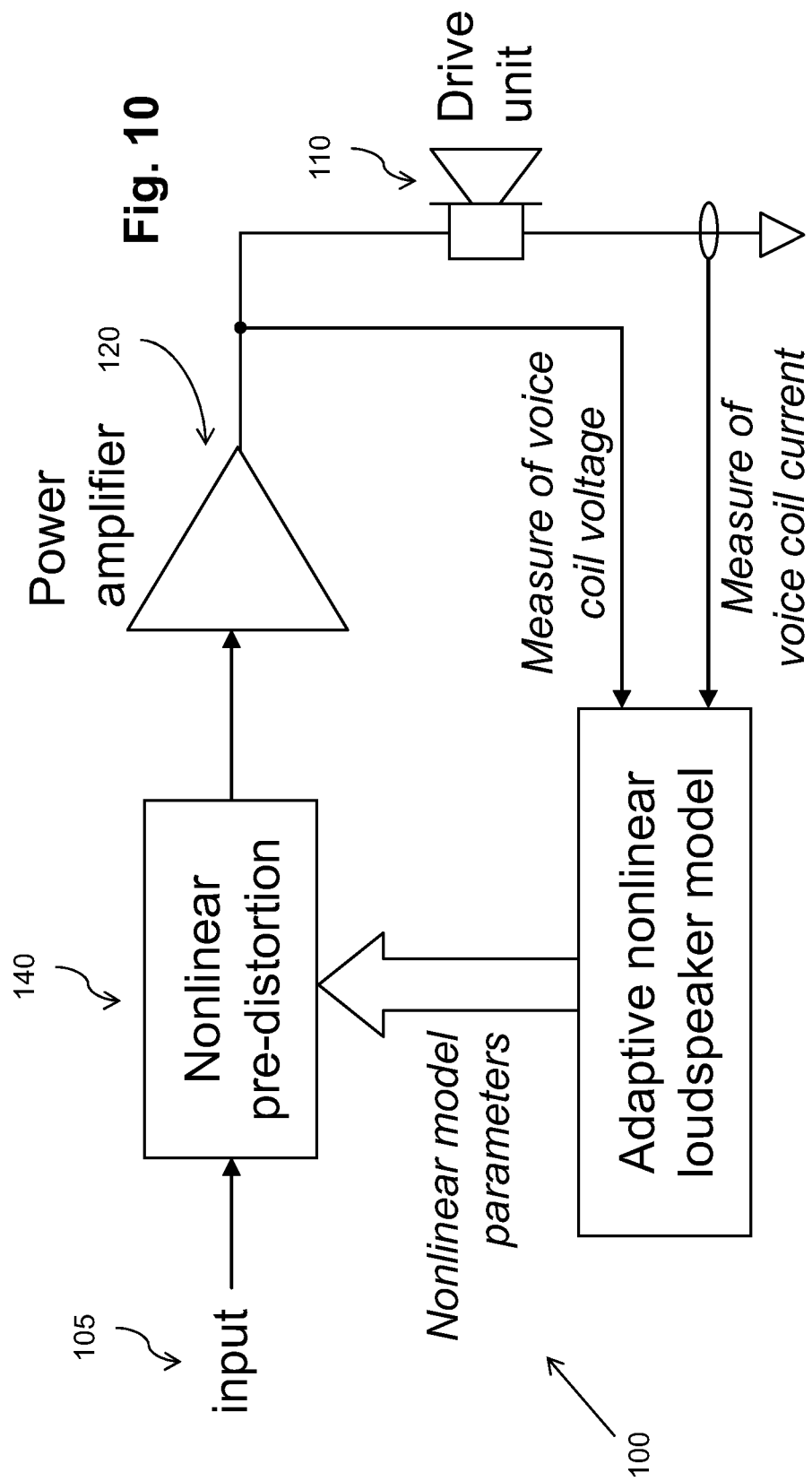
FIG. 10 illustrates the use of adaptive model-based linearisation to cancel drive unit nonlinearities.

"Self-tuning" approaches may be used to model the loudspeaker. As one example, the applied voltage and measured voice coil current can be used, as illustrated conceptually in FIG. 10. Here, an adaptive nonlinear loudspeaker model is employed—typically created in a computer or digital signal processor—having parameters that can be automatically adjusted (by a suitable algorithm) so that they match those of the drive unit to be linearised. This optimisation process is facilitated by comparing the modelled drive unit voltage and current with those of the actual loudspeaker, whilst the loudspeaker is actually operating.

Regardless of how the nonlinear model is driven to convergence, once this has been achieved, the parameters of the nonlinear model are by definition representative of the actual target loudspeaker, and these same parameters can then be used to synthesise an accurate nonlinear "predistortion". As a result, this method is able to track changes in the drive unit's parameters over time and under different signal conditions. It is able to adapt to any given drive unit, so that no pre-programming of the linear or nonlinear parameters should be needed. In practice, however, it may be difficult to ensure consistent convergence under real-world conditions, due to the already-mentioned signal dependence of the mechanical nonlinearities. Also, the system cannot drive the nonlinear model to convergence unless there is a sufficient driving signal with appropriate frequency and statistical content.

As already discussed, an advantage of the "velocity follower" is that it may reduce the dependence of the loudspeaker's performance on the effective mechanical parameters of the moving system—i.e. mechanical resistance (friction) and, especially, stiffness. (Here, the effects of pneumatic stiffness of the air inside the loudspeaker enclosure can also be included.) The method may therefore be able to extend the lower frequency response limit of the loudspeaker, whilst at the same time reducing nonlinear distortion and other inconsistencies that would otherwise be caused by hard-to-predict and difficult-to-correct variations in the friction and stiffness. The principal disadvantages of the basic velocity follower (i.e. with resistance cancellation only) are two-fold:

Firstly, the loudspeaker's upper frequency response limit is lowered (compared with conventional voltage-fed operation), due to increased significance of the voice coil's inductive reactance relative to the effective residual DC resistance in the voice coil drive circuit. It has been found that this disadvantage can be ameliorated by partial electronic cancellation of the voice coil inductance, as described above and exemplified in FIG. 7b, and/or by shunting the voice coil motor with a conjugate impedance ("Zobel") network so as to counteract the tendency of the voice coil impedance to rise at higher frequencies, thus maintaining the degree of positive feedback applied at higher frequencies. Alternatively or additionally, various methods of reducing the inherent voice coil inductance can be applied to the basic voice coil motor design. Such means include adding highly-conductive (e.g. copper) shorting rings around the magnetic pole pieces of the voice coil motor, or placing a similarly conductive "cap" over the central magnetic pole.

Secondly, although the nonlinear distortion due to mechanical parameter variations is reduced, linearity of the resulting voice coil velocity response is still dependent on the motor force factor (previously denoted "Bl", in loudspeaker terminology) being substantially constant. Furthermore, for signal frequencies towards and above the velocity follower's upper bandwidth limit, the actual velocity may also be modulated by any variations in the voice coil inductance $L_E$. However, although Bl and $L_E$ exhibit undesirable dependence on the voice coil's axial displacement (and to some degree the voice coil current which may, in certain circumstances, even be dominant) this nonlinear behaviour is both predictable and repeatable. This is because it arises as a consequence of well-defined and stable geometric and magnetic properties of the voice coil and magnet structure, and is in contrast to the already-noted ill-defined and variable behaviour of the suspension stiffness and mechanical friction. Since in low frequency drive units ("woofers"—that is, loudspeakers intended for bass reproduction) both Bl and $L_E$ are generally strong functions of voice coil displacement x, the velocity follower's residual nonlinear distortion is usually dominated by artefacts that are introduced by Bl(x) and $L_E$(x).

Therefore, if the velocity follower technique is used to reduce nonlinear loudspeaker distortion due to the mechanical friction and stiffness, the dominant residual nonlinearities of the loudspeaker drive unit—which are relatively stable and well-defined—can be addressed by feed-forward correction. This is the basis of the present disclosure.

Linearised Velocity Follower

Figure 11:
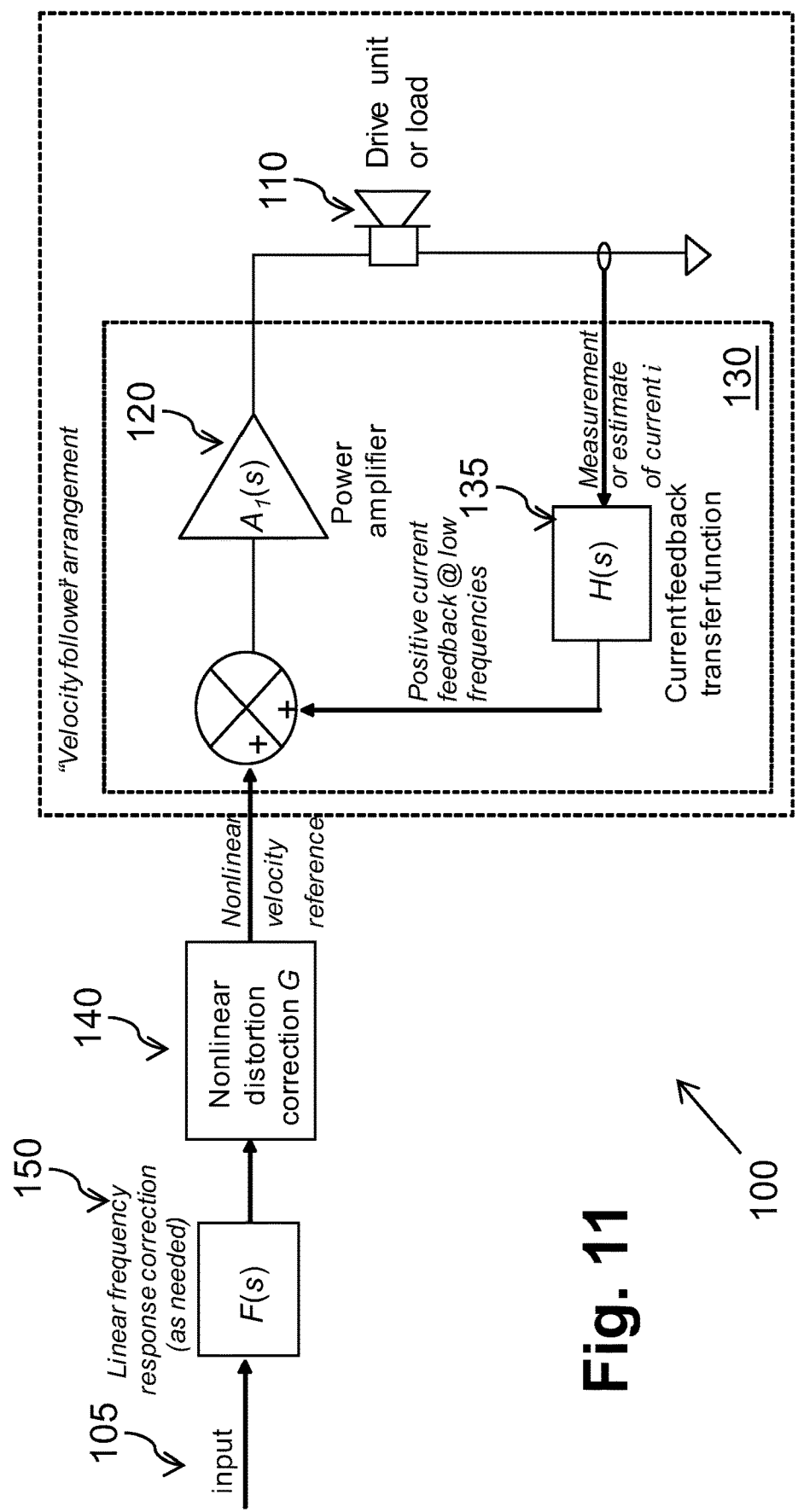
FIG. 11 shows a basic linearised velocity follower arrangement.

FIG. 11 illustrates the basic concept of a linearised velocity follower. The drive unit or load to be controlled and linearised is operated from power amplifier $A_1$, which is arranged to have a negative output impedance in order to partially or substantially cancel the load's own blocked (stationary) electrical impedance. Whilst other means could be used to generate the requisite negative output impedance in $A_1$, the preferred example uses positive feedback of current, as shown here. The current feedback is applied via a transfer function H(s) which may have low-pass or band-pass characteristics in order to ensure stability, and also to optimise the poles of the system when the feedback loop is closed, but which will have a substantially scalar response (close to flat amplitude response, and with minimal phase shift) in the desired frequency range of operation. The loudspeaker drive unit or other load then operates under effective velocity control over a limited but useful bandwidth with a substantial reduction in the distortions that would otherwise arise due to nonlinear behaviour of the mechanical stiffness and friction.

The velocity reference signal applied to the velocity follower is pre-distorted by a nonlinear function G which corrects for variations in the electromagnetic parameters, such as motor force factor (BI) and/or inductance ($L_E$). The transducer nonlinearity may only become serious when its output is relatively large, and therefore G may tend towards unity or some other constant value under small-signal and quiescent conditions. It will therefore be appreciated by those skilled in the art that G may, in one implementation, be structured so as to comprise a direct feed-through of the input to which a nonlinear distortion-correction signal is added.

Some degree of overall frequency response correction may be needed, for example to convert the desired signal to be reproduced acoustically to a velocity reference by integration over a limited frequency range, and to accurately define the working bandwidth of the system. Such frequency response correction is provided for in the linear transfer function F(s). It will be appreciated by those skilled in the art that—with suitable modification to G—it is possible to interchange the order of functions F and G without departing from the basic concept of the disclosure. Similarly, H(s) could be a scalar if desired, with such current loop frequency response shaping as may be needed implemented instead within the power amplifier's own transfer function $A_1(s)$.

An appropriate linearising function G may be determined by a skilled person by formulating a state-space description of the system, and then linearising the state equations so as to remove the nonlinearities of the drive unit. In other words, the linearising function G may be determined by transforming the state-space description of the drive unit using a transform which ensures that all the nonlinearities in the state equations are accessible from the system input, determining an input signal so as to cancel out the state nonlinearities, and then transforming the system of equations back to arrive at the requisite real-world linearising function. Note that the composite signal generated by function G may depend on both the incoming velocity reference signal and on estimates of state variables. That is, it may comprise both input-related and feedback components. The complexity of function required depends on which of the residual nonlinearities are to be addressed, and to what degree. The principal target nonlinearities are the motor force factor and voice coil inductance. In low-frequency loudspeakers, these are usually a strong function of displacement and a much weaker function of current, and it could be sufficient to correct only for the displacement-dependence of these parameters. Distortion due to the current-related dependence will, in loudspeakers intended for low frequency reproduction, usually be small compared with the residual distortion due to other causes, when evaluated in the linearised system. This is also true of the nonlinear reluctance force which is introduced by displacement-dependence of the inductance. Furthermore, in high frequency loudspeakers (e.g. "tweeters"), where the voice coil displacements are very small, it may be that the current-related nonlinearities of motor force factor and voice coil inductance dominate, in which case it may be appropriate to correct only for these and to neglect their displacement-dependence.

The inventor has arrived at the insight that particularly effective linearisation performance can be achieved by correcting for the nonlinearities of the transducer using velocity as one of the feedback components, despite the dominant nonlinearities not being a function of velocity. The composite signal generated by function G may thus depend on an estimate or measurement of velocity. However, in some examples, that composite signal may also depend on one or more of the other state variables (such as voice coil current and displacement). In the case of significant dependence of the nonlinearities on current, it may additionally or alternatively be desirable to incorporate into the composite function G a measure or estimate of the time rate-of-change of voice coil current, i.e. di/dt. This may be estimated by a mathematical operation incorporated in G and applied to the current signal, or alternatively could readily be estimated from the voltage developed across an inductive impedance inserted in series with the voice coil or load.

Control Arrangement Examples

Figure 12:
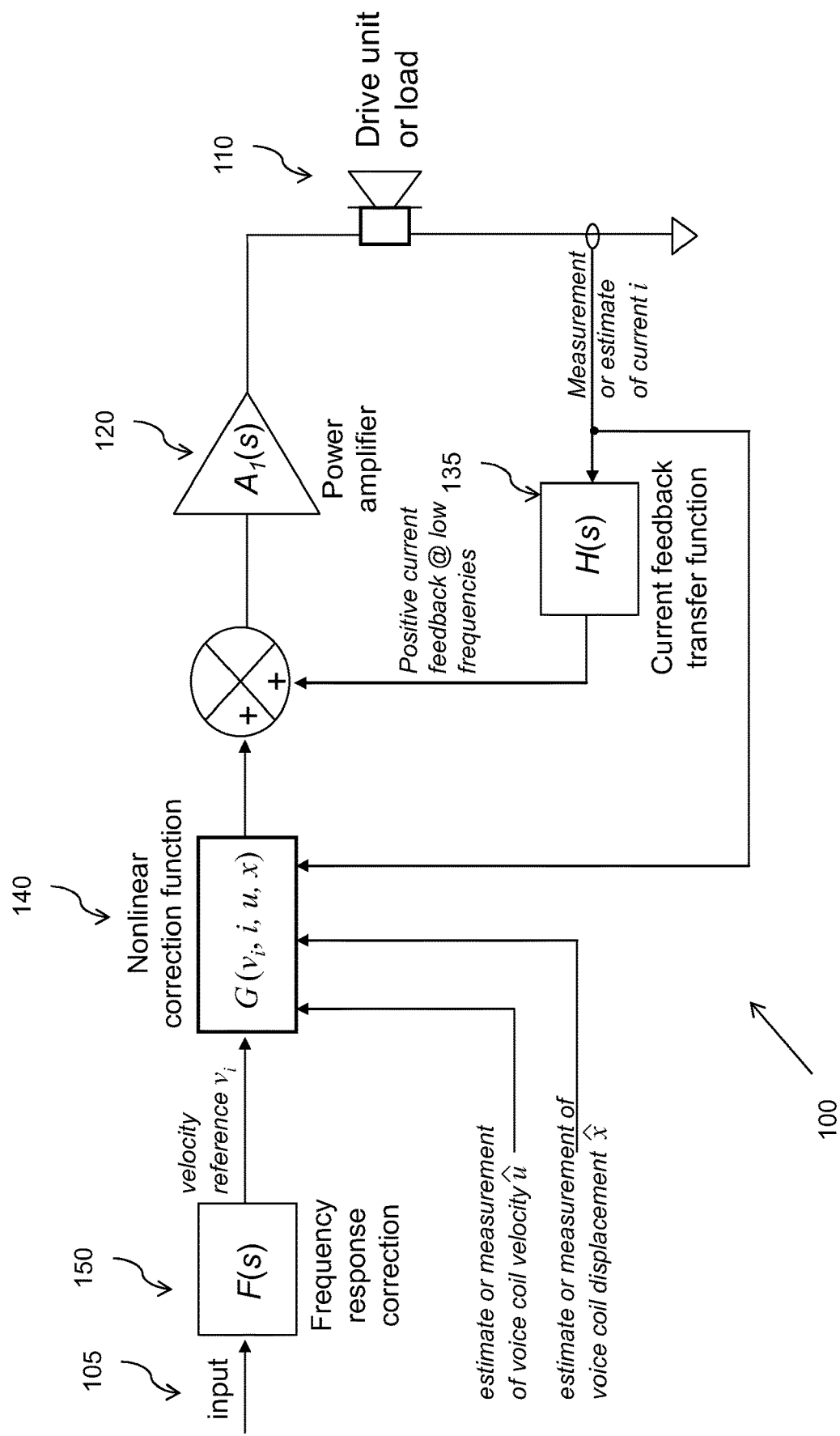
FIG. 12 shows an exemplary arrangement with predetermined nonlinear correction function G.
Figure 13:
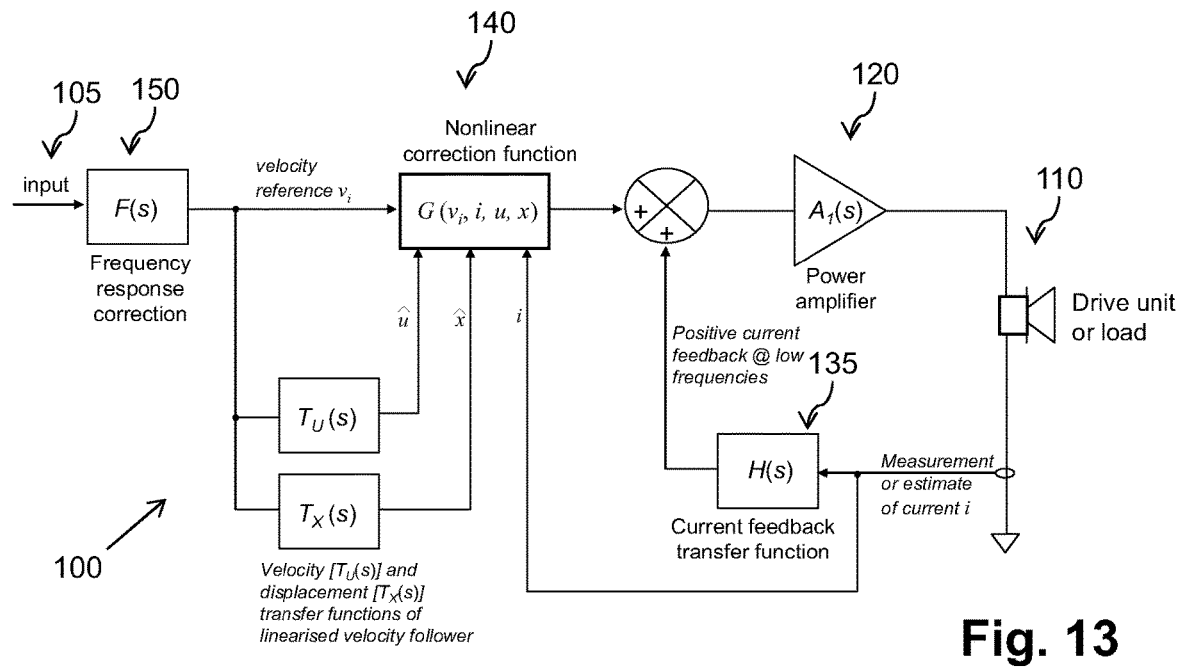
FIG. 13 shows the arrangement of FIG. 12, but with velocity and displacement estimation based on linearised transfer functions of the "velocity follower" arrangement.
Figure 14:
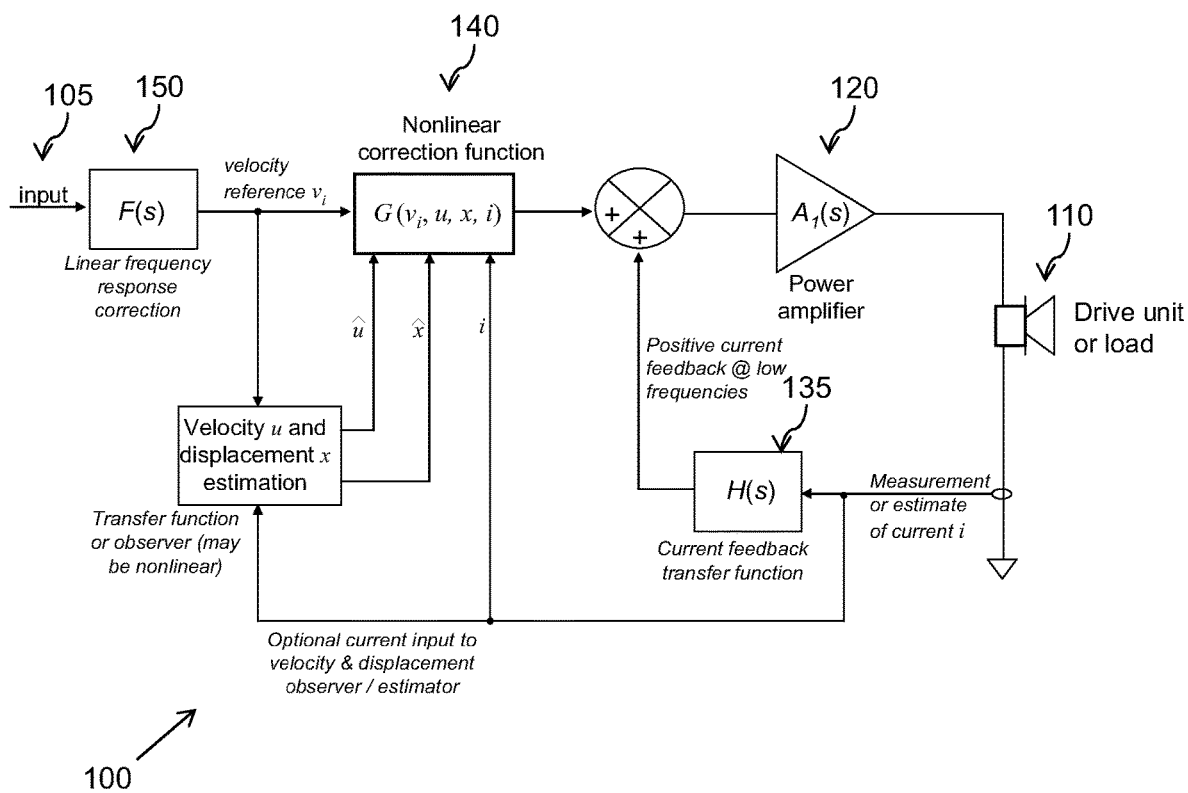
FIG. 14 shows the arrangement of FIG. 13, but with velocity and/or displacement estimation incorporating a measurement or estimate of voice coil current, and/or based on an observer for improved accuracy.

FIG. 12 shows a more detailed illustration of the linearised velocity follower. The linearising function G is generically synthesised based on the input signal, together with measurements or estimates of the drive unit's state variables—usually current i, velocity u and displacement x. Since the target electromechanical nonlinearities are generally well-defined and stable functions of displacement (and/or current, if this is being considered) the function G can without difficulty be made fixed for a particular design of drive unit. A self-optimising scheme could however be employed here instead, as will be discussed later. The current is readily measured directly using a shunt resistor, Hall sensor or other method known in the art. Velocity and displacement, however, may either be derived from a transducer-based measurement or—more conveniently—by estimation based on linear transfer functions, as shown in FIG. 13. Here, Tu(s) and Tx(s) are linear transfer functions that represent the velocity and displacement responses (respectively) of the linearised velocity follower. This works satisfactorily in practice but residual nonlinearities may impair the accuracy of the linearisation process itself, leading to greater residual distortion than would be the case if measurement-based estimates of velocity and displacement were available. This can be ameliorated by incorporating current in the process of estimating displacement and velocity, as shown in FIG. 14, where an "observer" type estimation approach—which may itself be nonlinear—may also be used to generate more accurate estimates of voice coil velocity and displacement.

Figure 15:
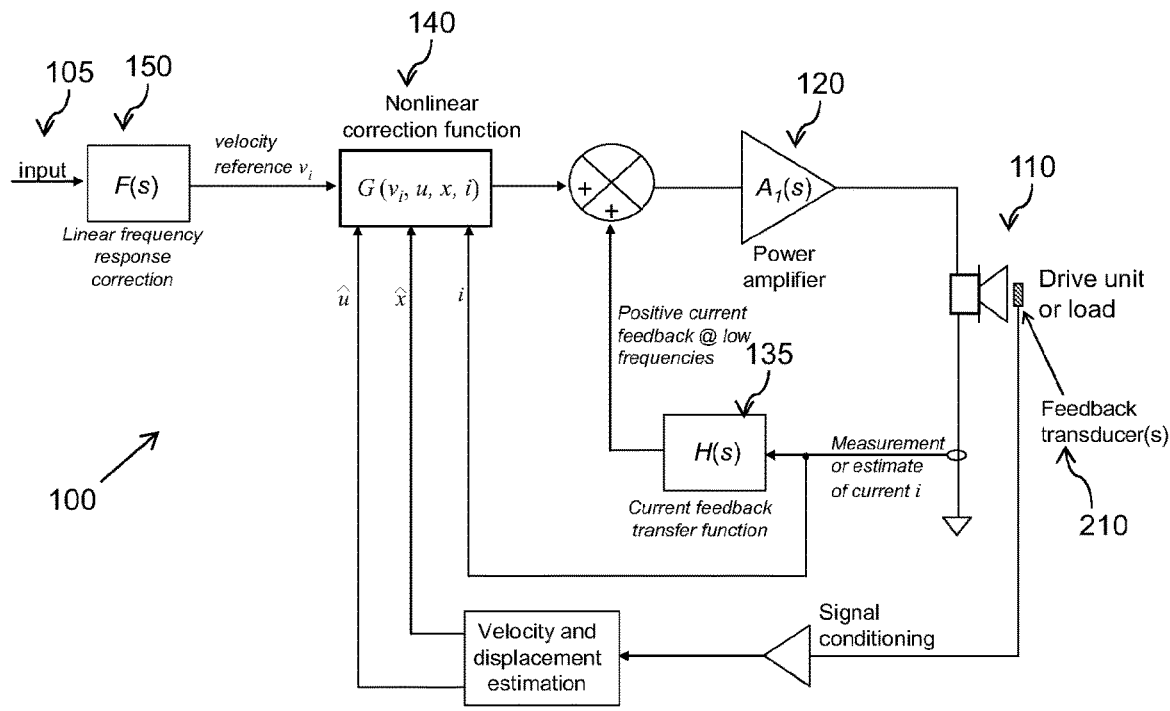
FIG. 15 shows the arrangement of FIG. 12, but with displacement and/or velocity estimates derived from a sensor.

A transducer can be used to measure a parameter of voice coil motion (displacement, velocity or acceleration). The transducer output can be used to generate more accurate estimates of velocity and position, as exemplified in FIG. 15. The same transducer can furthermore be used to apply negative feedback, e.g. of velocity (FIG. 16) or acceleration (FIG. 17). A combination of the velocity follower, nonlinear correction of electromagnetic parameters and an overall negative loop feedback as illustrated here is capable of yielding exceptionally low levels of distortion.

Whilst it is in principle possible to fully correct for the dependence of motor force factor and inductance on (for example) displacement, the inventor has arrived at the insight that it is also possible to obtain a majority of the benefit whilst using a reduced form of the ideal linearising function G, and in particular where synthesis of G does not require knowledge of all the drive unit's state variables. This is illustrated in FIG. 18, where G is shown to be independent of voice coil current, but it will be appreciated that G could be independent of any one or any two of the state variables, depending on the dominant nonlinearities being targeted. Removing (in the example of FIG. 18) the dependence of G on voice coil current can be valuable in cost-sensitive digital implementations, where it allows for a reduced sampling rate (and eliminates the cost of the associated low-latency analogue-to-digital converter) compared with the full linearisation where current feedback is involved, and where— to avoid instability—a relatively fast sampling time may need to be used. It will be appreciated that this simplified arrangement could be employed in other examples described herein (such as those of FIGS. 12-17), and that various alternative arrangements and combinations of all the concepts and techniques discussed herein can be used without departing from the basic tenets of the present disclosure.

As discussed above, because the present disclosure targets the electromagnetic nonlinearities of the drive unit (motor force factor and inductance), which are relatively well-defined and stable, it is possible to pre-define the linearising function G to suit a given voice coil motor or drive unit.

Nevertheless, adaptive or "self-tuning" schemes have merits in terms, for example, of not requiring motor-specific design or programming, and in robustness to production tolerances and other factors that may result in variations of the drive unit's electromagnetic parameters. It is therefore envisaged that the methods and apparatuses described herein could equally well utilise an adaptive scheme, in which the conventional drive unit and amplifier are replaced with the velocity follower arrangement. The adaptive model would then need to be adjusted to account for the effective cancellation of the voice coil impedance implicit in the velocity follower, but the same adaptive or self-tuning principles could otherwise be applied.

Digital implementation may be considered. It will be apparent to one skilled in the art that, if a measure of the voice coil current is available in the digital domain with low latency, the velocity follower itself could—with suitable precautions concerning stability—also be implemented in the same digital signal processing facility. Similarly, any or all of the other transfer functions as illustrated in FIGS. 11-19 could be implemented digitally.

A linearised loudspeaker may give very little audible indication of imminent overload, and as the present disclosure is also concerned with extending the lower frequency response limit of the loudspeaker, there is a risk of mechanical overload of the drive unit when reproducing programme material at high levels and/or with substantial low frequency content. (This is sometimes called "bottoming", where the voice coil displacement reaches the maximum mechanically permissible value, resulting in serious and sudden distortion, and furthermore risking mechanical damage to the drive unit). It may therefore be prudent to take steps to mitigate or avoid this, for example, by modifying the frequency response correction F(s) in response to an estimate of displacement, in order to temporarily raise the lower cut-off frequency of the overall linearised loudspeaker system. Alternatively, a similar increase in lower cut-off frequency could be achieved by lowering the amount of positive feedback applied by H(s); this however may needlessly impair linearity (by reducing the amount of effective motional feedback in play).

Finally, the electrical resistance of the voice coil or load will generally be a significant function of temperature, and is therefore strongly influenced by $i^2R$ heating in normal operation, as well as by ambient temperature. This in turn affects the amount of resistance cancellation needed for a given performance of the velocity follower. It may therefore be desirable to apply temperature compensation to the system, or to automatically servo, via for instance variation of H(s), the net resistance in the voice coil circuit to a target value. Either will have the effect of increasing the negative output resistance of $A_1$ as the voice coil resistance rises with temperature.

Figure 20:
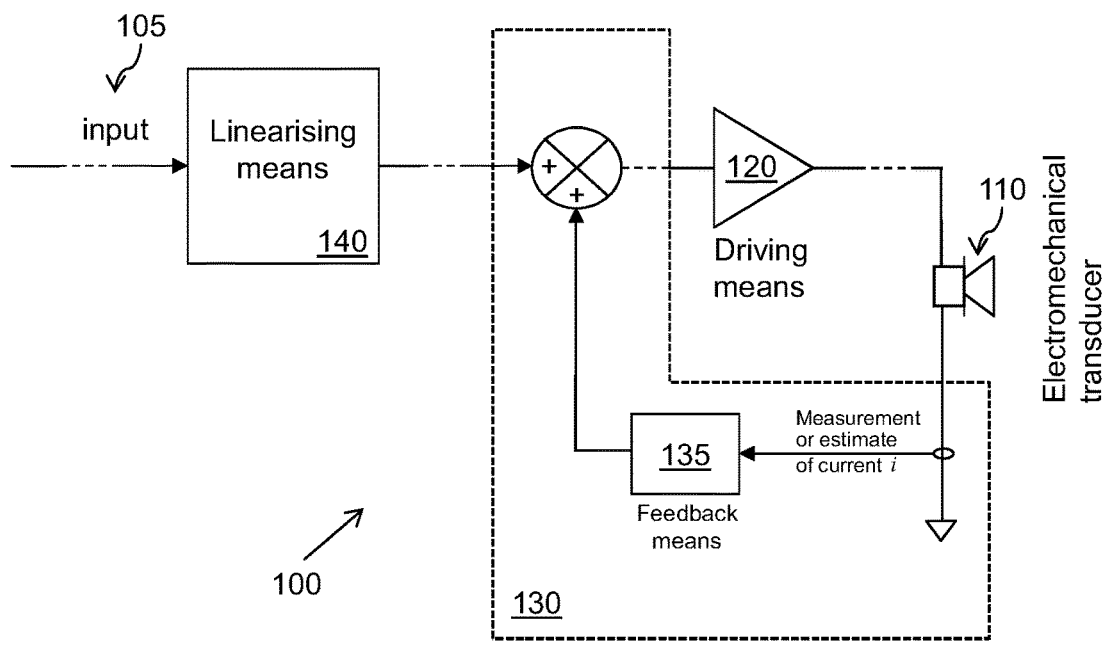
FIG. 20 shows a diagram of a control arrangement as described herein.

A controller 100 (or 'control circuit', or 'control arrangement') for an electromechanical transducer 110 comprises circuitry, components or modules which may result in the sound pressure generated by the transducer more closely matching a desired sound pressure based on the driving input signal. Such a controller is illustrated in FIG. 20. In the present disclosure, the transducer 110 is a loudspeaker drive unit but the transducer 110 may be any electrodynamic load, e.g., a motor or a solenoid. In one example, the controller 100 may be the "linearised velocity follower" of any of the above examples.

The controller 100 comprises driving means 120 (or 'driving circuitry', or 'a driver', or 'a driving module'), which are operable to drive the transducer 110, i.e., to actuate a mechanical output of the transducer 110. The mechanical output may, in particular, comprise an actuating coil, or an actuating magnet. In one example, the mechanical output may comprise a voice coil. The driving means 120 may, for example, comprise an amplifier, such as the power amplifier of FIGS. 2 to 19.

The controller 100 further comprises impedance cancelling means 130 (or 'impedance cancelling circuitry', or 'an impedance canceller', or 'an impedance cancelling module'), which are operable to at least partially cancel an electrical impedance of the transducer 110. In one example, the impedance cancelling means 130 may be the "velocity follower" arrangement as described above.

The impedance cancelling means 130 may comprise feedback means 135 (or 'feedback circuitry', or 'feedback determining circuitry', or 'feedback determining means', or 'a feedback determiner', or 'a feedback determining module') for feeding a feedback signal to the driving means based on a current signal indicative of a current (an actuating current) in the transducer 110. The feedback means 135 may be operable to derive the feedback signal based on the current signal by applying a feedback filter, such as the filter H(s) of FIGS. 8 and 11 to 19, to the current signal.

The impedance cancelling means 130 at least partially cancel the electrical impedance of the transducer 110 by providing the driving means 120 with a negative output impedance. The negative output impedance may be based on a temperature of the transducer 110. The temperature may be determined using a temperature sensor, which may be coupled to, attached to, built in to, or form part of, the transducer 110 or a voice coil thereof.

Alternatively or additionally, the impedance cancelling means 130 may be operable to match the negative output impedance to the electrical impedance of the transducer 110. When the transducer 110 comprises a coil (e.g., an actuating coil), the value of the electrical impedance of the transducer 110 may be determined by applying a direct voltage or direct current (DC) to the actuating coil and determining a ratio of coil voltage and coil current. Alternatively or additionally, the value of the electrical impedance of the transducer 110 may be determined by: applying respective low-pass filters to each of coil voltage and coil current to respectively yield a filtered coil voltage and a filtered coil current, the respective low-pass filters each having a cut-off frequency that is lower than a mechanical resonance of the transducer 110; and determining a ratio of the filtered coil voltage and the filtered coil current.

The controller 100 further comprises linearising means 140 (or 'linearising circuitry', 'a lineariser', 'a linearising module') between an input 105 of the controller 100 and the driving means 120. The linearising means 140 are operable to generate an output signal by modifying an input signal of the linearising means 140 to compensate for nonlinear behaviour of the transducer 110, in other words, to compensate for nonlinear characteristics of the transducer 110.

In particular, the linearising means 140 may be operable to modify the input signal to the linearising means 140 to compensate for one or more of:

a force factor of the transducer 110, i.e., BI; or
an inductance of the mechanical output of the transducer 110, i.e., $L_E$.

In particular, the linearising means may compensate for variations in the force factor or the inductance.

The linearising means 140 are operable to receive one or more state signals indicative of one or more respective state variables of the transducer 110. The inventor has arrived at the insight that although the dominant nonlinearities of the transducer 110 may be a function of the displacement of the mechanical output of the transducer 110, compensating for nonlinear behaviour of the transducer 110 using a measurement or estimate of the velocity may result in the controller 100 performing unexpectedly well, despite the dominant nonlinearities of the transducer 110 not being a function of velocity. Thus, the one or more state signals received by the linearising means may comprise a velocity signal indicative of a velocity of the mechanical output of the transducer 110.

However, as described above, the one or more state signals received by the linearising means may additionally, or alternatively, comprise any other state signal indicative of a state variable of the transducer 110, such as one or more of:

a displacement signal indicative of a displacement of the mechanical output of the transducer 110; or
a current signal indicative of a current in the transducer 110.

The modifying performed by the linearising means may be dependent on the input signal of the linearising means 140, as illustrated in FIGS. 11 to 19, where the nonlinear correction function G is dependent on the velocity reference signal $v_i$. The linearising means may comprise a nonlinear filter (or 'nonlinear function'). The linearising means may apply any mathematical operator to the one or more state signals including, as one example, a differential operator.

At least one of the one or more state signals may be determined by feedback, i.e., by measuring the one or more state signals. In particular, the one or more state signals may be determined using a sensor 210, which may be coupled to the transducer 110 (specifically, the mechanical output of the transducer 110). Such a sensor 210 may be referred to as a 'feedback transducer', and may, for example, be an accelerometer or a microphone. This sensor may, in one example, measure at least one of a displacement, a velocity, or an acceleration associated with the mechanical output of the transducer 110.

Figure 16:
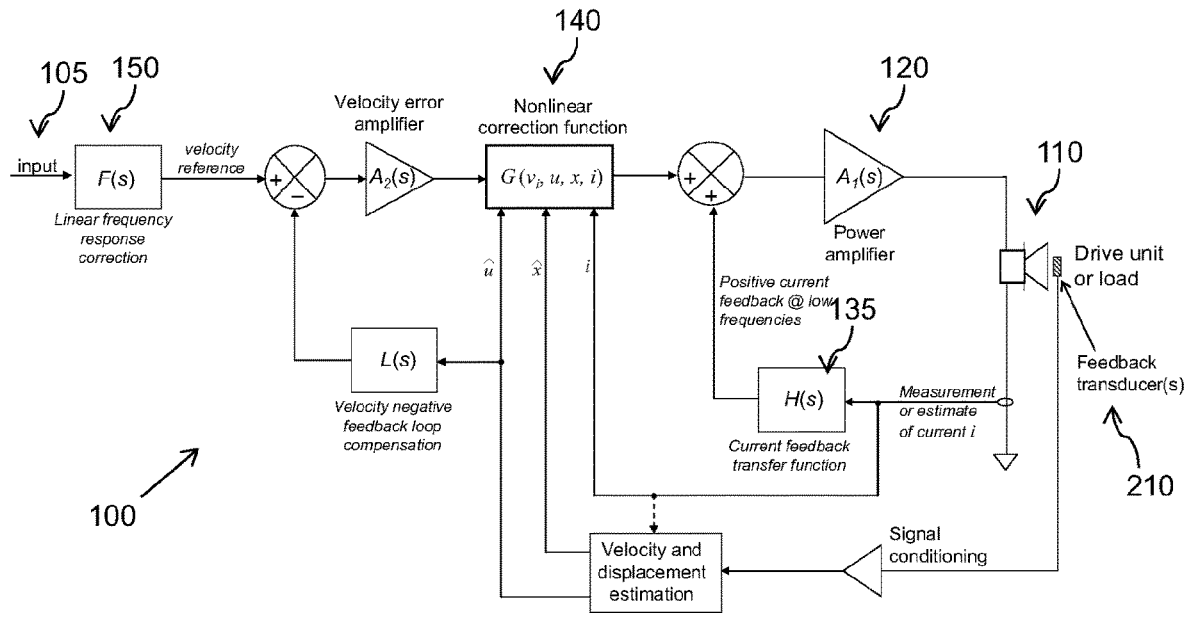
FIG. 16 shows the arrangement of FIG. 15, but with additional overall control loop providing further linearisation through negative feedback of velocity.
Figure 17:
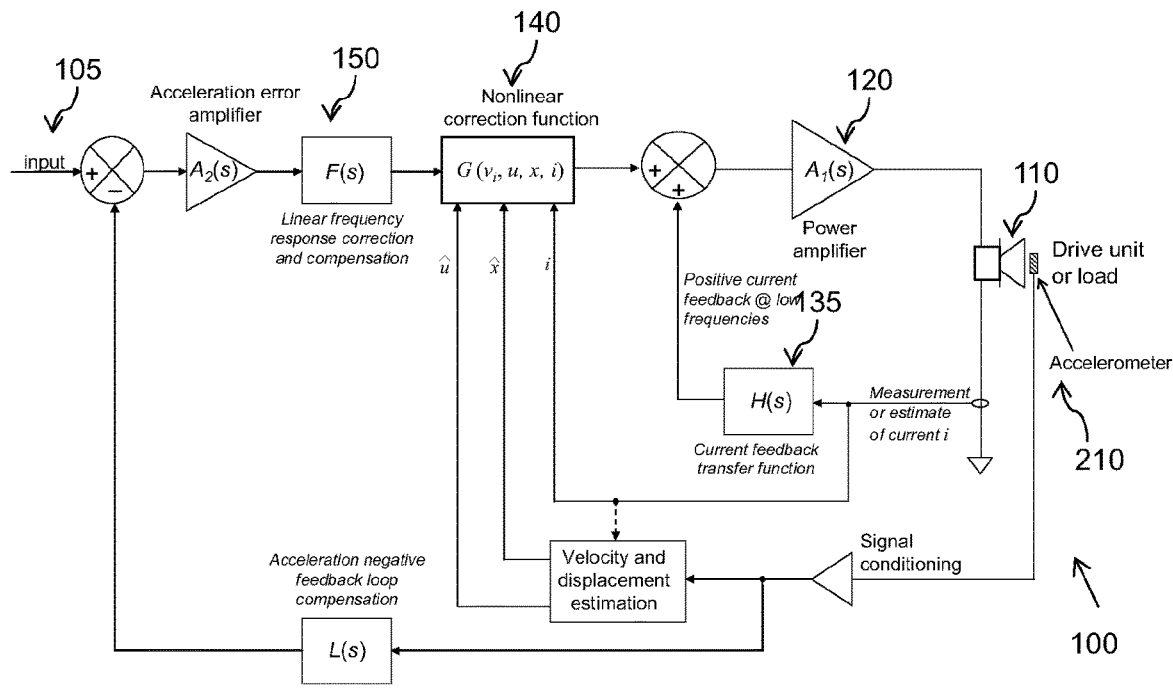
FIG. 17 shows the arrangement of FIG. 15, but with additional overall control loop providing further linearisation through negative feedback of acceleration.
Figure 18:
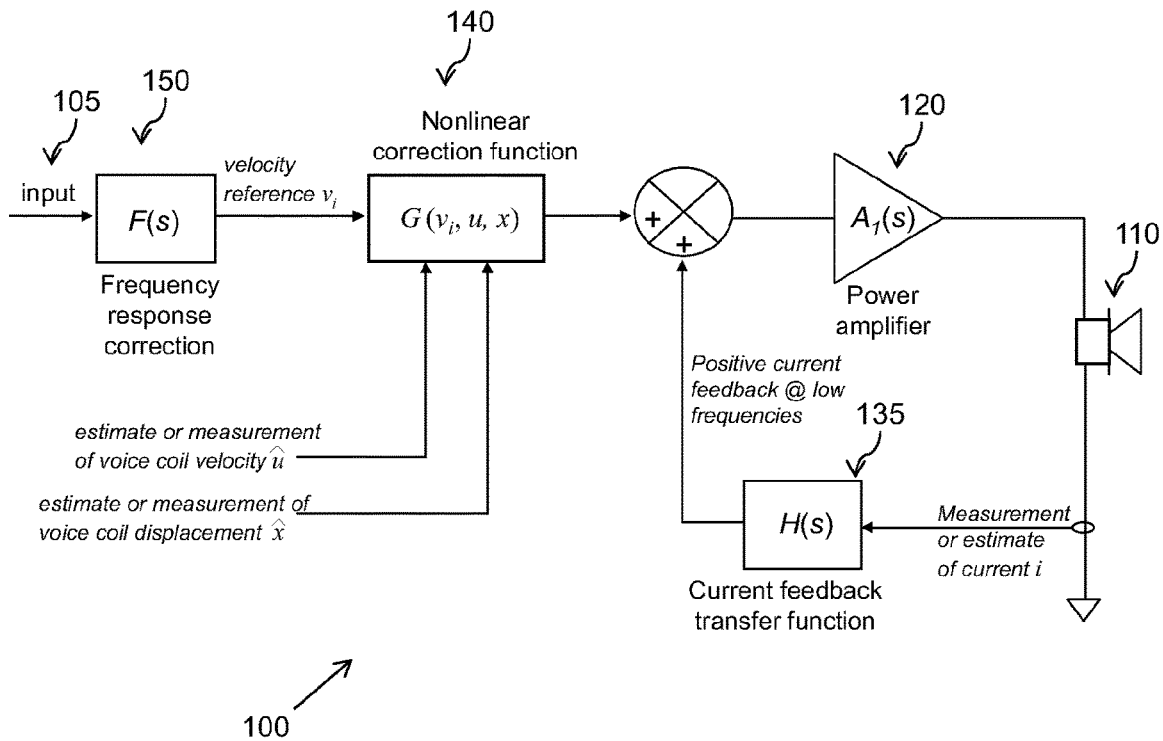
FIG. 18 shows a simplified version of FIG. 12, with a linearising function that is independent of current.
Figure 19:
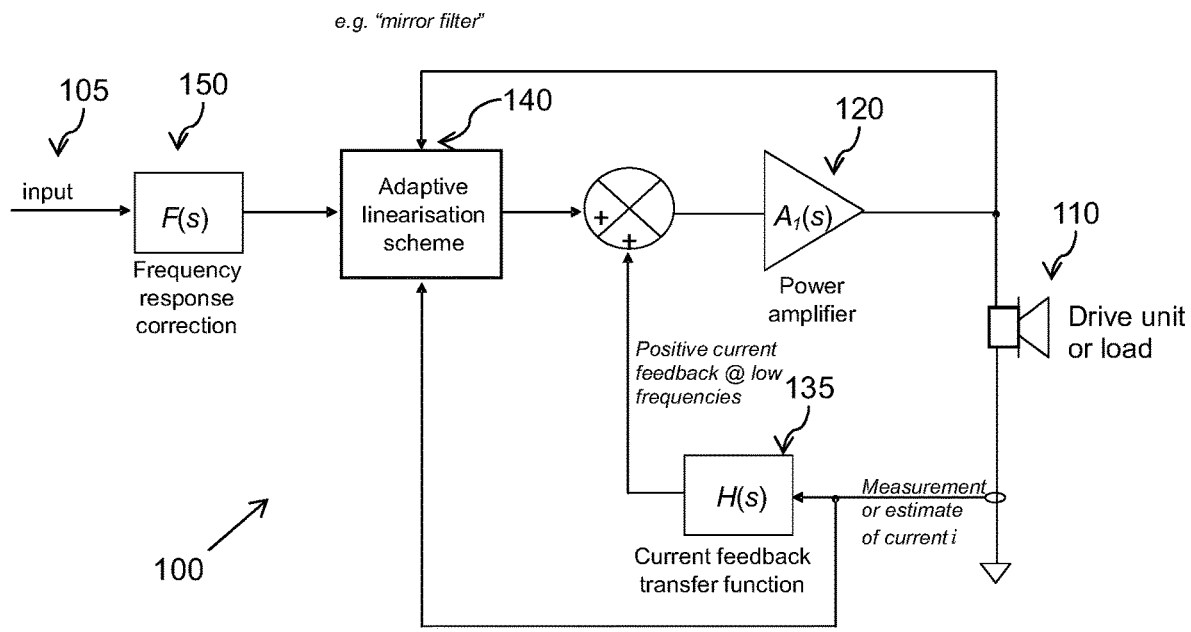
FIG. 19 shows the arrangement of FIG. 11, but with linearisation of electromagnetic and/or electromechanical nonlinearities provided by a self-optimising algorithm.

Based on the measurement of the sensor 210, negative feedback may also be applied, as illustrated in FIGS. 16 to 17. Applying negative feedback may, for example, comprise applying at least one of a displacement signal, velocity signal or acceleration signal, respectively indicative of a displacement, velocity, or an acceleration associated with the mechanical output of the transducer 110. This negative feedback may be applied to an input of the linearising means 140, or to the input 105 of the controller 100.

Alternatively or additionally, at least one of the one or more state signals may be determined based on the input signal of the linearising means 140 or an input signal of the controller 100. In particular, the at least one of the one or more state signals may be determined by applying a filter to the input signal of the linearising means 140 or the input signal of the controller 100, as illustrated in FIGS. 13 to 14. The filter may, in one example, be a linear filter, as illustrated in FIG. 13.

Alternatively or additionally, at least one of the one or more state signals may be determined based on a current signal indicative of a current in the transducer 110, as illustrated in FIGS. 12 to 18 and more particularly in FIG. 14.

In one example, the output signal of the linearising means 140 may be based on a model of the transducer 110 (e.g., may be generated using a model of the transducer 110), and the model may be adapted based on the one or more state variables.

In one example, the linearising means may be logically or physically split as illustrated in FIG. 21. In particular, the output signal of the linearising means may be determined by summing 1) a first signal that is determined by applying a first filter (or 'first nonlinear function'—e.g., a pre-distortion filter) to the input signal 105 to the controller 100, and 2) a second signal that is determined by applying a second filter (or 'second nonlinear function'—e.g., a nonlinear feedback synthesis filter) to the one or more state signals.

The controller 100 may further comprise an equalising filter 150 between the input 105 of the controller 100 and the transducer 110, e.g., between the input 105 of the controller 100 and the linearising means 140. The equalising filter 150 may be operable to maintain a frequency response of the transducer at a target frequency response. In one example, the equalising filter 150 may be operable to increase its lower cut-off frequency based on at least one of the one or more state variables. In particular, the equalising filter 150 may increase its lower cut-off frequency consequent to determining that a displacement of the mechanical output of the transducer 110 has exceeded a threshold, in order to avoid mechanical overload.

The feedback means 135 may be operable to decrease an amount of positive feedback applied based on at least one of the one or more state variables, e.g., consequent to determining that a displacement of the mechanical output of the transducer 110 has exceeded a threshold.

The impedance cancelling means 130 and/or the linearising means 140 may be embodied in a programmed computer processor.

A method of operating a controller for an electromechanical transducer, e.g., the controller 100 of any of the examples described herein, is provided. The method may comprise at least one of the steps of:

actuating a mechanical output of an electromechanical transducer using driving means;
cancelling an electrical impedance of the transducer;
providing linearising means between an input of the controller and the driving means; and
using the linearising means,
modifying an input signal of the linearising means to compensate for nonlinear behaviour of the transducer, and
receiving one or more state signals indicative of one or more respective state variables of the transducer,
the one or more state signals optionally comprising a velocity signal indicative of a velocity of the mechanical output of the transducer.

A non-transitory computer-readable medium is provided. The medium carries computer-readable instructions arranged, upon execution by a processor, to cause the processor to implement any of the examples described herein, e.g., to implement the method described above.

Examples of the present disclosure are set out below.

A moving coil loudspeaker drive unit—or similar electrodynamic load—is driven by an amplifier arranged to have negative output impedance. Said negative output impedance shall cancel the load's blocked electrical impedance to a degree such that the drive unit operates as a velocity-controlled device over the target operating bandwidth. The resulting "velocity follower" arrangement is then combined with a linearising function which modifies the input to the velocity follower, so as to counteract the residual nonlinearities of the load when operated in the basic velocity follower arrangement.

The arrangement as described in (1) where the linearising function is synthesised based upon the input signal and one or more state variables of the drive unit or load.

The arrangement of (2) wherein the mechanical state variables required for synthesis of the linearising function are estimated by linear transfer functions acting upon the signal input to the linearised system.

The arrangement of (2) wherein the mechanical state variables required for synthesis of the linearising function are estimated by an estimator or observer utilising a measure or estimate of the drive unit current as well as the system's input.

The arrangement of (1) where the linearising function utilises an adaptive model-based arrangement, in which load voltage and/or current and/or other state measurements of the load are compared with modelled values so as to drive convergence of the nonlinear digital model to match the load, and wherein the parameters of that model are then used to synthesise the signal needed to counteract the residual nonlinearities of the load when operated in the basic velocity follower arrangement.

The arrangement of (1) to (5) wherein overall frequency response correction is applied to the linearised system in order to yield desired target upper and lower bandwidth limits.

The arrangements of (1)-(6) wherein the lower frequency response limit of the system is automatically raised in response to extremes of voice coil or load displacement, this being effected by modifying either the frequency response correction F(s) or the amount of positive feedback H(s) in response to a measurement or estimate of displacement.

The arrangements of (1)-(7) wherein the magnitude of the negative output resistance furnished by $A_1$ is modified in response to variations in voice coil or load temperature, as determined by a temperature sensor attached to or built in to the voice coil or load.

The arrangements of (1) to (7) wherein the magnitude of the negative output resistance furnished by $A_1$ is modified in response to variations in voice coil or load resistance, so as to maintain a substantially constant overall effective DC resistance in the voice coil/amplifier output circuit mesh.

The arrangement of (9) wherein resistance of the voice coil or load is estimated by deliberately applying a small DC voltage or current to the voice coil or load, and calculating the ratio of measured or applied voltage to current.

The arrangement of (9) wherein the resistance of the voice coil or load is estimated by separately low-pass filtering the voice coil voltage and voice coil current, using a cut-off frequency less than that of the drive unit or load's mechanical resonance, and calculating the resistance estimate from the ratio of filtered voltage to filtered current.

The arrangements of (8) to (11) wherein the magnitude of the negative output resistance is modified by adjusting the zero frequency (DC) value of the positive current feedback gain H.

The arrangements of (1)-(7) wherein the magnitude of the negative output resistance furnished by $A_1$ is modified in response to variations in voice coil or load temperature, by varying the sensitivity of the current measurement means.

Those skilled in the art will recognise that a wide variety of modifications, alterations, and combinations can be made with respect to the above described examples without departing from the scope of the disclosed concepts, and that such modifications, alterations, and combinations are to be viewed as being within the ambit of the disclosed concepts.

Those skilled in the art will also recognise that the scope of the invention is not limited by the examples described herein, but is instead defined by the appended claims.

The section headings contained in the present disclosure are for reference purposes only, and are not intended to limit the scope of this disclosure.

The approaches described herein may be embodied on a computer-readable medium, which may be a non-transitory computer-readable medium. The computer-readable medium carries computer-readable instructions arranged for execution upon a processor so as to make the processor implement any or all of the examples described herein.

The term "computer-readable medium" as used herein refers to any medium that stores data and/or instructions for causing a processor to operate in a specific manner. Such storage medium may comprise non-volatile media and/or volatile media. Non-volatile media may include, for example, optical or magnetic disks. Volatile media may include dynamic memory. Exemplary forms of storage medium include, a floppy disk, a flexible disk, a hard disk, a solid state drive, a magnetic tape, or any other magnetic data storage medium, a CD-ROM, any other optical data storage medium, any physical medium with one or more patterns of holes, a RAM, a PROM, an EPROM, a FLASH-EPROM, NVRAM, and any other memory chip or cartridge.

The invention claimed is:

1. A controller for an electromechanical transducer, the controller comprising:
   driving means operable to actuate the mechanical output of the transducer;
   impedance cancelling means operable to at least partially cancel an electrical impedance of the transducer, the impedance cancelling means being operable to apply positive feedback by feeding a feedback signal to the driving means based on a current signal indicative of a current in the transducer; and
   linearising means between the input of the controller and the driving means, the linearising means being operable to:
      receive state signals indicative of state variables of the transducer, the state signals comprising a velocity signal indicative of a velocity of the mechanical output of the transducer and a displacement signal indicative of a displacement of the mechanical output of the transducer; and
      generate an output signal by modifying an input signal to the linearising means to at least partially cancel nonlinearity of the transducer, the output signal being generated based at least in part on:
         determining a first signal by applying a nonlinear pre-distortion filter to the input signal;
         determining a second signal by applying a nonlinear feedback synthesis filter to the state signals; and summing, as the output signal, the first signal and the second signal.

2. The controller of claim 1, wherein the state signals further comprise a current signal indicative of a current in the transducer.

3. The controller of claim 1, wherein the modifying is dependent on the input signal of the linearising means.

4. The controller of claim 1, wherein at least one of the state signals is determined by measurement.

5. The controller of claim 4, wherein the at least one of the state signals that is determined by feedback is determined using a sensor coupled to the transducer.

6. The controller of claim 5, wherein negative feedback is applied to an input of the linearising means or the input of the controller based on a measurement of the sensor.

7. The controller of claim 1, wherein at least one of the state signals is determined based on the input signal of the linearising means or the input signal of the controller.

8. The controller of claim 1, wherein at least one of the state signals is determined based on a current signal indicative of a current in the transducer.

9. The controller of claim 1, wherein the output signal of the linearising means is based on a model of the transducer, and wherein the model is adapted based on the state variables.

10. The controller of claim 1, wherein the linearising means are operable to modify the input signal of the linearising means to at least partially cancel nonlinearity caused by variations in a force factor of the transducer.

11. The controller of claim 1, wherein the linearising means are arranged to modify the input signal of the linearising means to at least partially cancel nonlinearity caused by variations in an inductance of the transducer.

12. The controller of claim 1, further comprising an equalising filter between the input of the controller and the transducer.

13. The controller of claim 12, wherein the equalising filter is operable to increase its lower cut-off frequency based on at least one of the state variables.

14. The controller of claim 1, wherein the impedance cancelling means are operable to derive the feedback signal based on the current signal by applying a feedback filter to the current signal.

15. The controller of claim 1, wherein the impedance cancelling means are operable to decrease an amount of positive feedback applied based on at least one of the state variables.

16. The controller of claim 1, wherein the impedance cancelling means are operable to at least partially cancel the electrical impedance of the transducer by providing the driving means with a negative output impedance.

17. The controller of claim 16, wherein the impedance cancelling means are operable to match the negative output impedance to the electrical impedance of the transducer.

18. The controller of claim 14, wherein the impedance cancelling means are operable to at least partially cancel the electrical impedance of the transducer by providing the driving means with a negative output impedance and wherein the impedance cancelling means are operable to adapt the negative output impedance by adjusting a zero frequency gain of the feedback filter.

19. The controller of claim 1, wherein at least one of:
the impedance cancelling means are embodied in a programmed computer processor;
the linearising means are embodied in a programmed computer processor; or
the driving means comprise an amplifier.

* * * * *